(12) United States Patent
Bisson et al.

(10) Patent No.: US 7,813,121 B2
(45) Date of Patent: Oct. 12, 2010

(54) COOLING HIGH PERFORMANCE COMPUTER SYSTEMS

(75) Inventors: Sylvio Bisson, Secteur Aylmer (CA); Willi Manfred Lotz, Ontario (CA)

(73) Assignee: Liquid Computing Corporation, Ottawa (CA)

( * ) Notice: Subject to any disclaimer, the term of this patent is extended or adjusted under 35 U.S.C. 154(b) by 737 days.

(21) Appl. No.: 11/669,897

(22) Filed: Jan. 31, 2007

(65) Prior Publication Data

US 2008/0180903 A1 Jul. 31, 2008

(51) Int. Cl.
*H05K 7/20* (2006.01)

(52) U.S. Cl. ............... 361/679.51; 361/695; 361/679.5; 361/679.53; 454/184

(58) Field of Classification Search ................. 361/687, 361/679.53, 695, 679.5, 679.51; 454/184
See application file for complete search history.

(56) References Cited

U.S. PATENT DOCUMENTS

| | | | |
|---|---|---|---|
| 4,561,040 A | | 12/1985 | Eastman et al. |
| 5,339,221 A | * | 8/1994 | Conroy-Wass et al. ...... 361/796 |
| 5,706,668 A | | 1/1998 | Hilpert |
| 6,000,623 A | | 12/1999 | Blatti et al. |
| 6,272,007 B1 | | 8/2001 | Kitlas et al. |
| 6,373,697 B1 | | 4/2002 | Lajara et al. |
| 6,388,880 B1 | | 5/2002 | El-Ghobashy et al. |
| 6,445,581 B1 | | 9/2002 | Carbonneau et al. |
| 6,525,935 B2 | | 2/2003 | Casebolt |
| 6,542,362 B2 | | 4/2003 | Lajara et al. |
| 6,801,428 B2 | | 10/2004 | Smith et al. |
| 6,836,030 B2 | | 12/2004 | Smith et al. |
| 6,867,966 B2 | | 3/2005 | Smith et al. |
| 6,909,611 B2 | | 6/2005 | Smith et al. |
| 6,924,981 B2 | * | 8/2005 | Chu et al. .................... 361/696 |
| 6,987,673 B1 | * | 1/2006 | French et al. ............... 361/727 |
| 7,042,720 B1 | * | 5/2006 | Konshak et al. ........ 361/679.33 |
| 7,139,170 B2 | * | 11/2006 | Chikusa et al. ............. 361/695 |
| 7,154,748 B2 | * | 12/2006 | Yamada ...................... 361/690 |
| 7,187,547 B1 | * | 3/2007 | French et al. .......... 361/679.33 |

(Continued)

OTHER PUBLICATIONS

Alienware, "Alienware: The Best Custom Built Gaming PC for the Ultimate PC Gamer!", http://www.alienware.com/intro_pages/liquidcooling.aspx, printed Dec. 4, 2006, 3pgs.

(Continued)

*Primary Examiner*—Anatoly Vortman
(74) *Attorney, Agent, or Firm*—DLA Piper LLP US

(57) ABSTRACT

A computer system may include a chassis defining a front and a rear. The chassis may include a vertically oriented midplane disposed therein, the midplane including a plurality of front module slots for receiving front electronic modules from the front of the chassis, and a plurality of rear module slots for receiving rear electronic modules from the rear of the chassis. A cooling system may be provided within the chassis and may generate an upwardly-directed front air flow within the chassis directed at selected ones of the front electronic modules and an upwardly-directed rear air flow within the chassis directed at selected ones of the rear electronic modules. The front air flow is separate from and independent of the rear air flow. The selected front and rear electronic modules may be disposed in the chassis so as to separate the front air flow into a plurality of substantially equal front air streams and the rear air flow into a plurality of substantially equal rear air streams, respectively.

32 Claims, 13 Drawing Sheets

U.S. PATENT DOCUMENTS

| | | | |
|---|---|---|---|
| 7,215,552 B2* | 5/2007 | Shipley et al. | 361/721 |
| 7,262,962 B1* | 8/2007 | McLeod et al. | 361/679.48 |
| 2002/0126449 A1 | 9/2002 | Casebolt | |
| 2003/0053293 A1* | 3/2003 | Beitelmal et al. | 361/687 |
| 2003/0221817 A1 | 12/2003 | Smith et al. | |
| 2003/0223193 A1 | 12/2003 | Smith et al. | |
| 2003/0223196 A1 | 12/2003 | Smith et al. | |
| 2003/0223199 A1 | 12/2003 | Smith et al. | |
| 2003/0224645 A1 | 12/2003 | Smith et al. | |
| 2004/0109288 A1* | 6/2004 | Beitelmal et al. | 361/687 |
| 2004/0190243 A1 | 9/2004 | DiStefano | |
| 2004/0264128 A1* | 12/2004 | Crippen et al. | 361/687 |
| 2005/0024825 A1 | 2/2005 | Smith et al. | |
| 2005/0083651 A1 | 4/2005 | Smith et al. | |
| 2005/0168945 A1 | 8/2005 | Coglitore | |
| 2006/0176665 A1* | 8/2006 | Matsushima et al. | 361/687 |
| 2007/0002536 A1* | 1/2007 | Hall et al. | 361/695 |
| 2007/0178822 A1 | 8/2007 | Lanus et al. | |
| 2007/0274039 A1* | 11/2007 | Hamlin | 361/695 |
| 2008/0055846 A1* | 3/2008 | Clidaras et al. | 361/687 |
| 2008/0094799 A1* | 4/2008 | Zieman et al. | 361/695 |
| 2008/0113604 A1* | 5/2008 | Tufford et al. | 454/187 |

OTHER PUBLICATIONS

International Search Report issued in International Application No. PCT/CA2008/000180, amiled May 14, 2008.

Written Opinion of the International Searching Authority of May 14, 2008 in corresponding PCT application PCT/CA2008/000180.

* cited by examiner

COOLING HIGH PERFORMANCE COMPUTER SYSTEMS

BACKGROUND OF THE INVENTION

1. Field of the Invention

Embodiments of the present invention relate generally to cooling systems for high performance computer systems and components thereof.

2. Description of the Prior Art and Related Information

The present invention relates to cooling of high performance electronic systems, and computer systems in particular, such as described in the commonly assigned and co-pending U.S. patent application Ser. No. 11/530,410, filed Sep. 8, 2006, entitled "Methods and Systems for Scalable Interconnect", which application is hereby incorporated herein by reference in its entirety. Briefly, electronic components of such high performance computer systems are housed in modules that are located in one or more cages (card cages). In turn, these cages are disposed in equipment chassis or cabinets.

Simple air circulation around the electronic components that generate heat is often not sufficient, and methods of assisted cooling are required. Conventional cooling methods include: equipping heat generating components with heat sinks and fans; directing air by fans and baffles at the heat sinks; heat pipes; and liquid cooling such as described in U.S. Pat. No. 4,561,040 in which a cooling liquid is circulated through a heat sink that is attached to the device. A more recent example of liquid cooling available for electronic devices is found in http://www.alienware.com/intro_pages/liquidcooling.aspx.

In conventional packaging of an electronic system in an equipment chassis or cabinet, with electronic components mounted on modules, air is circulated through the system using blowers (fans). The fans may be mounted, for example, in the bottom of the chassis (or cabinet) and blow air from an air inlet upward to pass over the modules. The blown air, now heated by the modules, escapes the chassis or cabinet through an air outlet that may be disposed at or near the top of the chassis.

The chassis may be located side-by-side with other chassis in rows, separated by aisles. Conventionally, cool air may be provided by the building system in "cool" aisles while the warm air, having passed through the chassis, is exhausted into "warm" aisles. The ASHREA (American Society of Heating, Refrigerating and Air-Conditioning Engineers) and NEBS (Network Equipment Building Standards) provide guidelines for the installation and cooling aspects of equipment chassis or cabinets.

Baffles in the chassis may be used to direct the air flow from the "cool" aisle into the chassis, air filters are generally used in the air inlet, and the chassis may be enclosed to confine the airflow over the components that are to be cooled. Air filters may be used in the air inlet to insure that only filtered air passes over the components to be cooled.

The electronic modules may be open at the bottom and at the top, which allows air to pass directly over the electronic components and their respective heat sinks.

While such conventional methods of cooling rack mounted electronic systems are fairly well established in the industry, the increasing power dissipation of high performance electronic components requires more efficient cooling methods.

SUMMARY OF THE INVENTION

It is therefore an object of the present invention to develop a comprehensive cooling architecture to provide improved cooling of densely packed high power electronic components.

According to an embodiment thereof, the present invention is a computer system. The computer system may include a chassis defining a front and a rear, the chassis including a vertically (for example) oriented midplane, the midplane including a plurality of front module slots for receiving front electronic modules from the front of the chassis, and a plurality of rear module slots for receiving rear electronic modules from the rear of the chassis; a cooling system, the cooling system being configured to generate an upwardly-directed front air flow within the chassis directed at selected ones of the front electronic modules and being configured to generate an upwardly-directed rear air flow within the chassis directed at selected ones of the rear electronic modules, the front air flow being separate from and independent of the rear air flow.

The selected front electronic modules may dissipate more power than remaining ones of the front electronic modules and the selected rear electronic modules may dissipate more power than remaining ones of the rear electronic modules. The cooling system may include one or more front fans disposed between the selected front electronic modules and remaining ones of the front electronic modules and one or more rear fans disposed between the selected rear electronic modules and remaining ones of the rear electronic modules. The front fan(s) may be configured to draw air past the remaining front electronic modules and to accelerate the drawn air to form the front air flow. The rear fan(s) may be configured to draw air past the remaining rear electronic modules and to accelerate the drawn air to form the rear air flow. The cooling system may include front fans disposed below the selected front electronic modules and rear fans disposed below the selected rear electronic modules. The cooling system may include an inlet separator baffle and an exhaust separator baffle. The inlet separator baffle, the midplane and the exhaust separator baffle may be collectively configured in the chassis such that the front air flow and the rear air flow are isolated from one another and independently controlled. The cooling system may include a front fan tray module coupled to the chassis for generating the upwardly directed front air flow and a rear fan tray module coupled to the chassis for generating the upwardly directed rear air flow. The front fan tray module and the rear fan tray module may be each removably coupled to the chassis. The front electronic modules may include front function modules and front interconnect modules. The rear electronic modules may include rear function modules and rear interconnect modules. The front fan tray modules may include a number of front fans that is less than the number of the front function modules and the rear fan tray module may include a number of rear fans that is less than the number of the rear function modules. The front air flow may enter a front plenum from which the front air flow divides into a plurality of front air streams by the selected front electronic modules. Similarly, the rear air flow may enter a rear plenum from which the rear air flow divides into a plurality of rear air streams by the selected rear electronic modules. The selected front electronic modules may be or may include front function modules and the selected rear electronic modules may be or include rear function modules. The plurality of front air streams may be substantially equal to one another and the plurality of rear air streams may be substantially equal to one another. Each of the front and rear fan modules may include at least a first and a second fan and the front plenum may be disposed between the at least first and second front fan of the front fan module and the selected front electronic modules, and the rear plenum may be disposed between the at least first and second rear fan of the rear fan module and the selected rear electronic modules.

The computer system may further include a plurality of sets of louvers, each of the plurality being disposed between an underlying one of the first and second fans of the front and rear fan tray modules and the front and rear plenums, respectively. The louvers of each of the plurality of sets of louvers may be configured to pivot to an open configuration when their respective underlying fan are operating and to pivot to a closed configuration when their respective underlying fan are not operating. The louvers of each of the plurality of sets of louvers may be configured to pivot to the closed configuration by a combination of gravity and the pressure of the air in either the front or rear plenum. The louvers of each set of louvers may be radially aligned with the center of their respective underlying fan. The sets of louvers disposed between the first and second fans of the front fan tray module and the front plenum may be pivotally coupled to a front louver tray configured to fit over the front fan tray module. The sets of louvers disposed between the first and second fans of the rear fan tray module and the rear plenum may be pivotally coupled to a rear louver tray configured to fit over the rear fan tray module.

The computer system may also include a plurality of front function modules received into selected ones of the front module slots and a plurality of rear function modules received into selected ones of the rear module slots, each of the front and rear function modules including: an electronic component, and a liquid cooling sub system including a cool plate coupled to the electronic component to absorb heat generated by the electronic component; a pump; a fluid-to-air heat exchanger; tubing connecting the cool plate, the pump and the heat exchanger in a closed circuit, and closed circuit cooling fluid that is pumped through the closed circuit to transport heat from the cool plate to the heat exchanger, and from the closed circuit cooling fluid to the front or rear air flow. Each of the front and rear function modules may have, for example, a six-sided volume shape that may be substantially closed on first to fourth sides, open on a fifth side for admitting the air flow, and terminated by the heat exchanger on a sixth side that is opposite the fifth side, such that most of the air flow that is directed thereto flows through the heat exchanger.

According to another embodiment, the present invention is a computer system that may include a chassis; a plurality of electronic modules to be cooled mounted within the chassis; at least two axial fans that may be horizontally mounted in a fan tray module within the chassis, the at least two fans being configured to generate an air flow into and pressurize a plenum within the chassis, the plenum being located between the fans and the plurality of electronic modules to be cooled.

The computer system may also include a set of pivotally coupled passive louvers disposed over an underlying one of each of the at least two axial fans, between the underlying axial fan and the plenum, the louvers of each set of louvers being configured to pivot to an open position when its underlying fan is operating, and to pivot to a closed position when its underlying fan is stopped. The louvers of each set of louvers may be configured to pivot to the open position when sufficient air flow is generated by its underlying fan and to pivot to the closed position when its underlying fan ceases to operate by a combination of gravity and the air pressure in the plenum generated by a remaining operating fan or fans.

The present invention, according to still another embodiment thereof, is a computer system comprising: a chassis; a plurality of N electronic modules mounted within the chassis; a plurality of M axial fans that are collectively configured to generate a combined air flow into an air plenum within the chassis for providing individual cooling air streams to a each of the plurality of N of electronic modules, wherein N>M and wherein the plurality of N electronic modules are disposed within the chassis such that the air plenum divides the combined air flow into N substantially equal individual air streams.

The air plenum within the chassis may be configured to divide the combined air flow into substantially equal individual air streams, even with only M−1 of the M axial fans operating. Airflow generated by each the N fans may pass through one of N sets of louvers such that each of the M axial fans that is operating holds the corresponding louver arrangement open, but failure of a fan causes the corresponding louver arrangement to close, to restrict an amount of air of the combined air flow that escapes through the failed fan.

Another embodiment of the present invention is a method of cooling a computer system, comprising: providing a chassis defining a front and a rear, the chassis including a vertically (for example) oriented midplane, the midplane including a plurality of front module slots for receiving front electronic modules from the front of the chassis, and a plurality of rear module slots for receiving rear electronic modules from the rear of the chassis; generating an upwardly-directed front air flow within the chassis directed at selected ones of the front electronic modules, and generating an upwardly-directed rear air flow within the chassis directed at selected ones of the rear electronic modules, such that the front air flow is separate from and independent of the rear air flow.

The front cooling flow generating step may include providing front fans below the selected front electronic modules and the rear cooling flow generating step may include providing rear fans disposed below the selected rear electronic modules. The method may further include providing an inlet separator baffle and an exhaust separator baffle such that the inlet separator baffle, the midplane and the exhaust separator baffle are configured such that the front air flow and the rear air flow are isolated from one another and independently controlled. The front air generating step may include providing a front fan tray module coupled to the chassis and the rear air generating step may include providing a rear fan tray module coupled to the chassis. The providing step may be carried out with the front electronic modules including front higher power dissipating modules and front lower power dissipating modules, with the rear electronic modules including rear higher power dissipating modules and rear lower power dissipating modules and the front air generating step generating step may be carried out with the front fan tray modules including a number of front fans that is less than the number of the front higher power dissipating modules and the rear air generating step may be carried out with the rear fan tray module including a number of rear fans that is less than the number of the rear higher power dissipating modules. The front air flow generating step may be carried out with the front air flow entering a front plenum from which the front air flow divides into a plurality of front air streams by selected ones of the front electronic modules and the rear air flow generating step may be carried out with the rear air flow entering a rear plenum from which the rear air flow divides into a plurality of rear air streams by selected ones of the rear electronic modules. The front air flow generating step may be carried out with the selected front electronic modules being configured to dissipate more power than remaining ones of the front electronic modules and the front air flow generating step may be carried out with the selected rear electronic modules being configured to dissipate more power than remaining ones of the rear electronic modules.

The front air flow generating step may be carried out with the plurality of front air streams being substantially equal to one another and the rear air flow generating step may be carried out with the plurality of rear air streams being substantially equal to one another. The front air flow generating step may include providing a first front fan and a second front fan and generating a front plenum between the first and second front fans and selected ones of the front module slots, and the rear air flow generating step may include providing a first rear fan and a second rear fan and generating a rear plenum between the first and second rear fans and selected ones of the rear module slots. The selected front module slots may be configured to receive electronic modules that may dissipate more power than remaining ones of the front electronic modules and the selected rear module slots may be configured to receive electronic modules that may dissipate more power than remaining ones of the rear electronic modules. The method may also include steps of providing first and second sets of front louvers disposed between an underlying one of the first and second front fans, respectively, and the front plenum and providing first and second sets of rear louvers disposed between an underlying one of the first and second rear fans, respectively, and the rear plenum. Constituent louvers of the sets of front and rear louvers may be configured to pivot to an open configuration when their respective underlying fan is/are operating and to pivot to a closed configuration when their respective underlying fan is/are stopped. The louvers of each of the first, second, front and rear sets of louvers may be configured to pivot to the closed configuration by a combination of gravity and the pressure of the air in either the front or rear plenum. The method may also include a step of restricting the amount of air that leaks back through a stopped one of the first, second, front and rear fans. The method may also include a step of providing a plurality of front function modules received into selected ones of the front module slots and a plurality of rear function modules received into selected ones of the rear module slots. Each of the front and rear function modules may include an electronic component, and a liquid cooling sub system including a cool plate coupled to the electronic component to absorb heat generated by the electronic component; a pump; a fluid-to-air heat exchanger; tubing connecting the cool plate, the pump, and the heat exchanger in a closed circuit. Closed circuit cooling fluid that may be pumped through the closed circuit to transport heat from the cool plate to the heat exchanger, and from the closed circuit cooling fluid to the front or rear air flow. Each of the front and rear function modules may, for example, have a six-sided volume shape that may be substantially closed on first to fourth sides, open on a fifth side for admitting the air flow, and terminated by the heat exchanger on a sixth side that is opposite the fifth side, such that most of the air flow that may be directed thereto flows through the heat exchanger.

Still another embodiment of the present invention is a method of cooling electronic modules within a computer system, comprising: providing a chassis; providing a backplane having a plurality of modules slots disposed away from one another in a vertical (for example) orientation and mounting the backplane in the chassis; coupling a plurality of electronic modules into corresponding ones of the plurality of module slots; generating an upwardly-directed air flow into an air plenum within the chassis below the electronic modules, and generating substantially equal individual cooling air streams from the air plenum to a space between the plurality of electronic modules.

The generating step may be carried out by a plurality of fans and the individual cooling air streams providing step may provide substantially equal individual cooling air streams even when fewer than all of the plurality of fans are operating.

BRIEF DESCRIPTION OF THE DRAWINGS

Embodiments of the present invention will now be described relative to the Figures, in which:

FIG. 2b is a perspective view of the fan tray module 200 of FIG. 2a;

FIG. 2c is another perspective view of the fan tray module 200 of FIG. 2a;

FIG. 2d is yet another perspective view of the fan tray module 200 of FIG. 2a;

DETAILED DESCRIPTION

The cooling system of the present invention has been developed for high performance computer systems (such as disclosed in, for example commonly assigned and co-pending U.S. patent application Ser. No. 11/530,410, incorporated by reference above). Such high performance computer systems may include one or more chassis. Each chassis may include, for example:

a vertically oriented midplane, having "function" and "interconnect" slots;

up to twenty (for example) high-power "service" (or "function") modules; and up to twenty (for example) lower-powered "interconnect" modules.

These components are mounted (plugged in) in cages within the chassis that may also include elements of the cooling system.

Figure 1A:
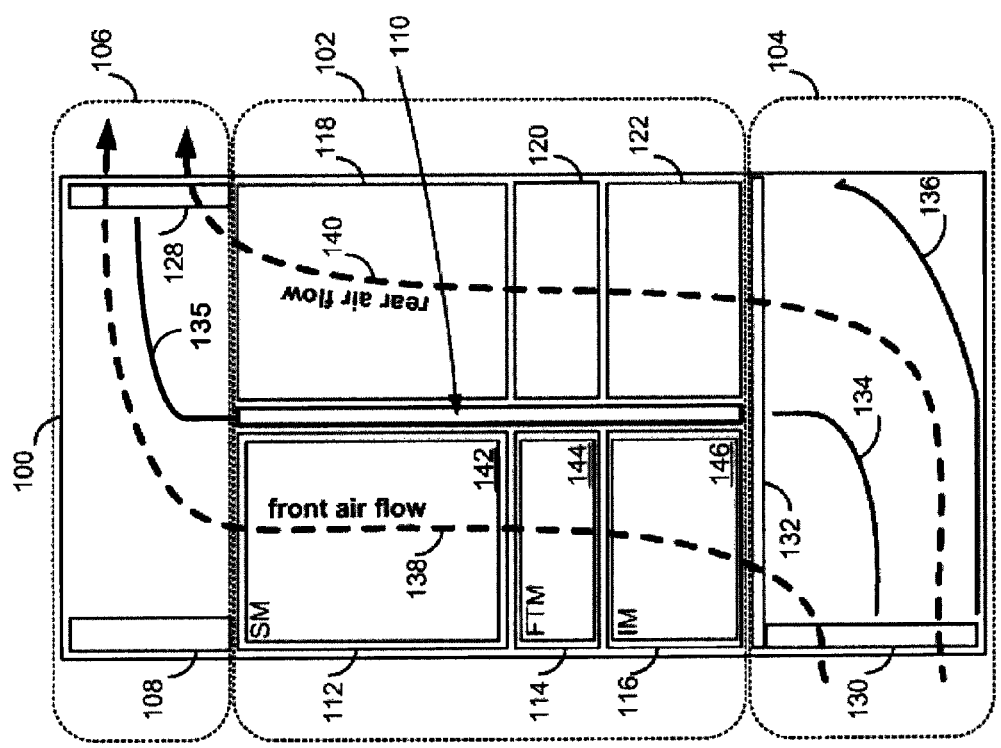
FIG. 1a is a cross-sectional side view of a chassis 100 of a high performance computer system according to an embodiment of the invention.
Figure 1B:
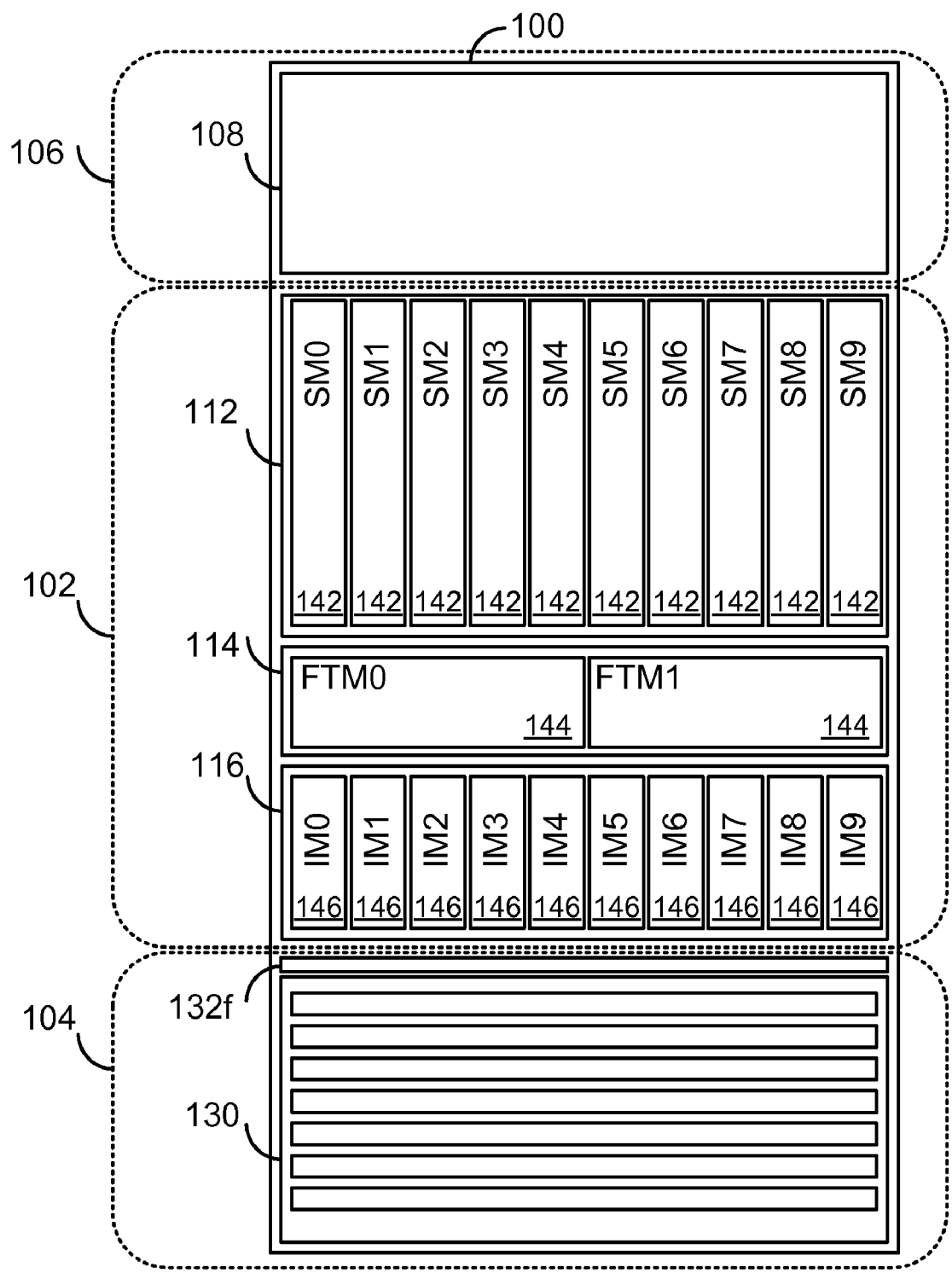
FIG. 1b shows a front view of the chassis 100 of FIG. 1.
Figure 1C:
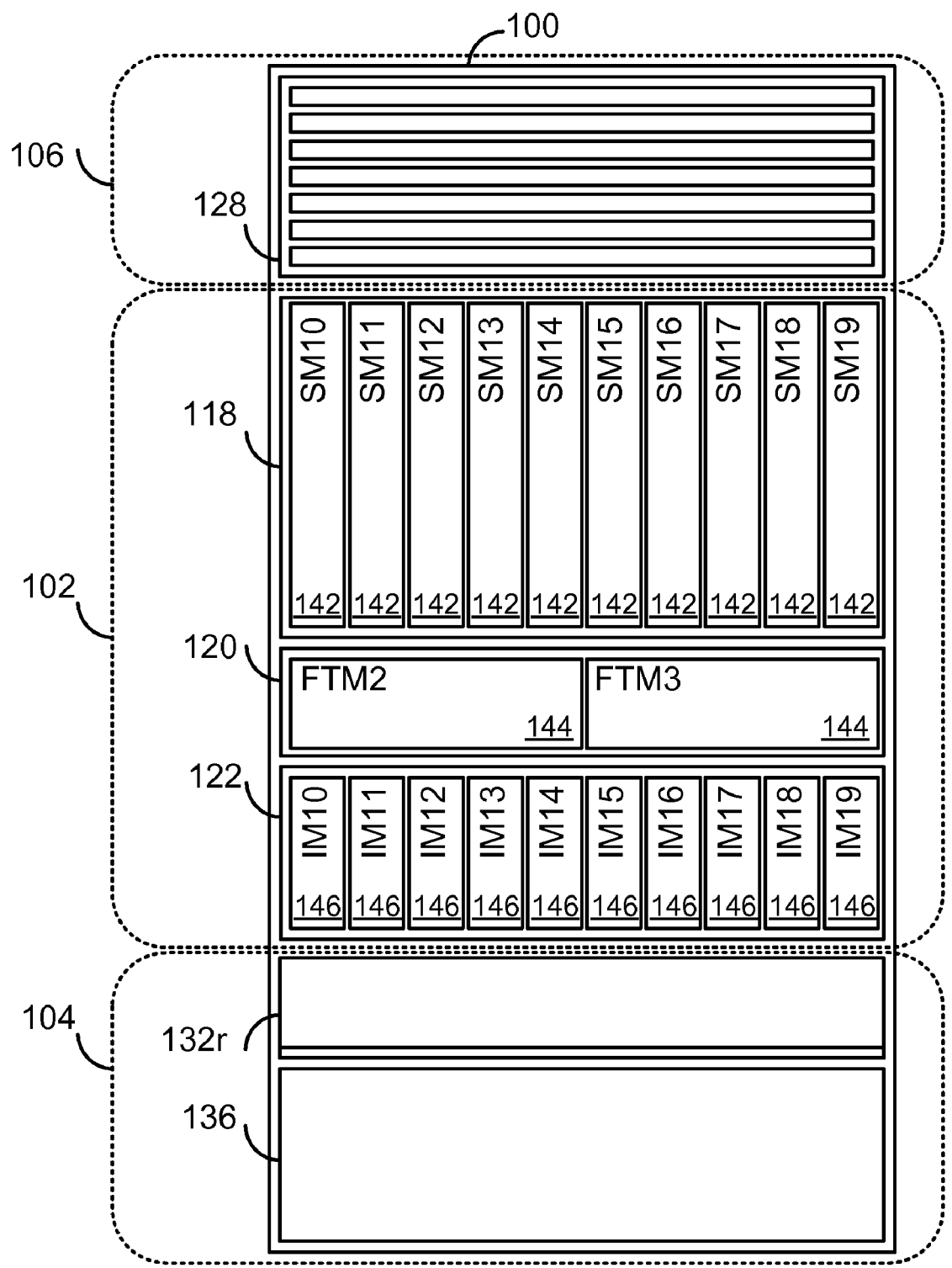
FIG. 1c shows a rear view of the chassis 100 of FIG. 1.

FIG. 1a (cut away side view), FIG. 1b (front view), and FIG. 1c (rear view) are simplified diagrams of a chassis 100 of a high performance computer system according to an embodiment of the invention. The chassis 100 may be housed in an equipment frame or a cabinet 101 shown in a dashed outline. The dimensions of the chassis 100 may, for example, be approximately 19" wide (for mounting in a 19 inch rack), 45.5" high, and 40" deep.

The exemplary chassis 100 includes an electronics sub-system 102 in the middle part of the chassis, an air inlet area 104 in the lower part of the chassis, and an air exhaust area 106 in the upper part. A breaker interface panel 108 is located near the front of the chassis 100 in the air exhaust area 106.

Other equipment outside the scope of this invention may be mounted in remaining space above or below the chassis 100 in a standard seven foot (7') equipment frame or cabinet.

In a first alternate embodiment of the invention, two chassis 100 may be mounted above one another in a single equipment frame or cabinet of sufficient height. In a second alternate embodiment of the invention, two chassis 100 with modified air inlet and outlets areas may be mounted above one another in a single equipment frame or cabinet of standard height (e.g. 7 feet). In either alternate embodiment, the size of the electronics sub-system 102 is unchanged, but in the second alternate embodiment, the heights of the air inlet and outlet areas are reduced.

As shown in the simplified cut-away side view of FIG. 1*a*, the electronics sub-system 102 may include a vertically oriented midplane 110 in the approximate center of the chassis 100, and two sets of cages (module cages) in the front and the rear of the midplane 110. The front of the midplane 110 may include, from top to bottom; a front service cage 112, a front fan tray cage 114, and a front interconnect cage 116. Similarly, the rear of the midplane 110 may include, from top to bottom; a rear service cage 118, a rear fan tray cage 120, and a rear interconnect cage 122.

As shown, the air inlet area 104 may include: a front grille 130; an air filter 132 and an inlet separator baffle 134. The air exhaust area 106 may include an exhaust separator baffle 135 and a rear grille 128. As shown, the air inlet area 104 may include a front grille 130; an air filter 132; an inlet separator baffle 134; and an inlet deflector baffle 136. Fan tray modules may be located within the front and rear fan tray cage (114 and 120, respectively), to be described in more detail below, which include fans driving two separate cooling fluid (e.g., air, other gases, liquid) flows through the chassis 100.

In operation, the cooling system shown in FIGS. 1*a*, 1*b* and 1*c* generates a front air flow 138 that enters the chassis near the bottom front of the chassis 100 through the front grille 130, and that travels successively through the air filter 132, the front interconnect cage 116, the front fan tray cage 114, and the front service cage 112, before exiting the chassis 100 at the top rear through the rear grille 128.

Similarly, a rear air flow 140 is generated and enters the bottom front of the chassis 100 (below the entry of the front air flow 138) through the front grille 130, and travels successively through the air filter 132, the rear interconnect cage 122, the rear fan tray cage 120, and the rear service cage 118, before exiting the chassis 100 near the top rear thereof through the rear grille 128 (below the exit front air flow 138).

As may be appreciated from FIG. 1*a*, the front air flow 138 is isolated from the rear air flow 140 by the inlet separator baffle 134, the midplane 110, and the exhaust separator baffle 135. Such isolated front and rear air flows enables the front and back modules of the electronics sub-system 102 to be cooled independently of one another.

In the illustrated exemplary embodiment, the front service cage 112 and the rear service cage 118 provide support for inserting service modules (SM) 142; the front fan tray cage 114 and the rear fan tray cage 120 provide support for inserting fan tray modules (FTM) 144; and the front interconnect cage 116 and the rear interconnect cage 122 provide support for inserting interconnect modules (IM) 146.

The front view of the chassis 100 within the cabinet is shown in FIG. 1*b*, using the same reference numerals for corresponding items as in FIG. 1*a*, i.e. from the top to the bottom:

the air exhaust area 106 including the breaker interface panel 108 (visible from the front);

the electronics sub-system 102 including the front service cage 112, the front fan tray cage 114, and the front interconnect cage 116, and the air inlet area 104 including and the front grille 130.

The rear view of the chassis 100, illustrated in FIG. 1*c*, similarly shows, using the same reference numerals for corresponding items in FIG. 1*a*, i.e. from the top to the bottom:

the air exhaust area 106 including the rear grille 128;

the electronics sub-system 102 including the rear service cage 118, the rear fan tray cage 120, and the rear interconnect cage 122, and the air inlet area 104 including the air filter 132.

In the exemplary embodiment illustrated in the three views (FIGS. 1*a*, 1*b*, and 1*c*), the electronics sub-system 102 provides plug-in space for functional modules within the three types of cages, such as, for example, ten service modules (SM) 142 in the front service cage 112;

another ten service modules (SM) 142 in the rear service cage 118;

two fan tray modules (FTM) 144 in the front fan tray cage 114;

another two fan tray modules (FTM) 144 in the rear fan tray cage 120;

ten interconnect modules (IM) 146 in the front interconnect cage 116, and another ten interconnect modules (IM) 146 in the rear interconnect cage 122.

To identify the individual slots in each cage, the modules are labeled (left to right):

service modules SM0 to SM9 in the front service cage 112;

service modules SM10 to SM19 in the rear service cage 118;

fan tray modules FTM0 to FTM1 in the front fan tray cage 114;

fan tray modules FTM2 to FTM3 in the rear fan tray cage 120;

interconnect modules IM0 to IM9 in the front interconnect cage 116, and interconnect modules IM10 to IM19 in the rear interconnect cage 122.

The cages provide the mounting support for the modules that are plugged into connectors (not shown) of the midplane 110 (shown in FIG. 1*a*, and as also shown in FIG. 10 of the U.S. patent application Ser. No. 11/530,410, incorporated by reference above).

The electronics sub-system 102 may be designed with forced air cooling to facilitate its thermal dissipation. The air inlet area 104 in the bottom of the chassis 100 below the electronics sub-system 102 allows air to enter from the front of the chassis 100. The air exhaust area 106 mounted in the top of the chassis 100 above the electronics sub-system 102, allows air to be exhausted through the rear of the chassis 100. The air moves in the form of two distinct air flows; namely the front air flow 138 and the rear air flow 140, through the cages of the electronics sub-system 102 from the bottom to the top, as indicated in the cut away side view of FIG. 1*a*.

The service modules 142 and the interconnect modules 146 may be configured as plug-in modules that carry electronic components which collectively dissipate sufficiently high power that cooling is required. The cooling system according to embodiments of the present invention may include two forced air flows (e.g., the front air flow 138 and the rear air flow 140), and may be designed to handle a total peak electrical load of about 17 kW of power within the chassis 100. It is to be understood, however, that the present cooling system may be readily designed to handle peak electrical loads that are greater or small than the exemplary amount of 17 kW. The forced air flows (138 and 140) may be generated by fans located in the fan tray modules 114 (FTM0 to FTM3), each of which may include, for example, two axial fans (for example, axial fans manufactured by EBM Papst of Farmington, Conn., part number EBM6448/2TDHHP).

Each service module 142 may further comprise a self-contained liquid cooling subsystem (to be described in greater detail below, FIG. 6). Briefly, the purpose of the liquid cooling subsystem is to transfer heat from certain electronic components to a heat exchanger mounted within the module. The heat exchanger is then exposed to the air flow (138 or 140) for cooling.

Figure 2A:
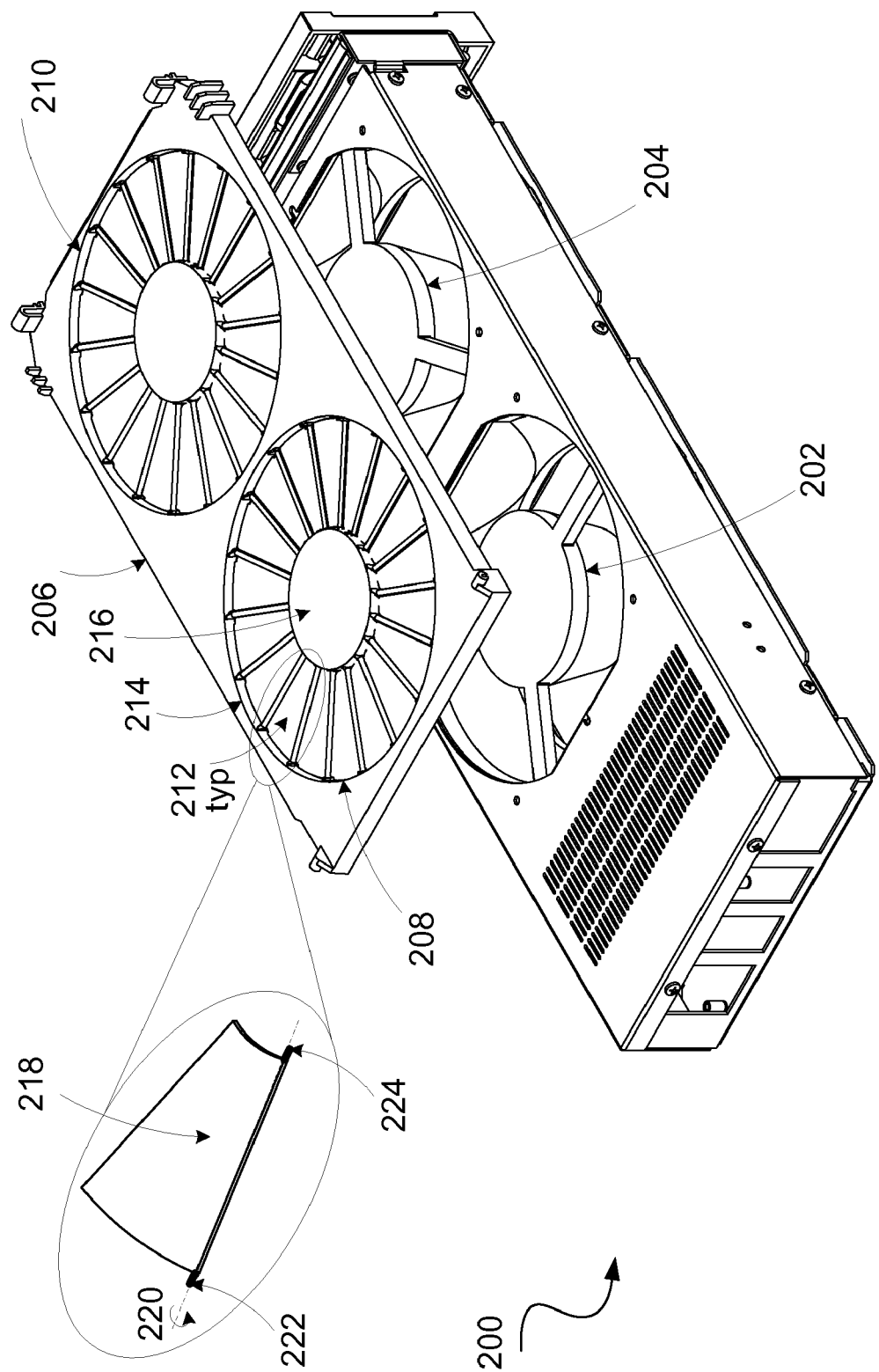
FIG. 2a is a perspective view of a fan tray module 200 according to an embodiment of the invention.
Figure 26:
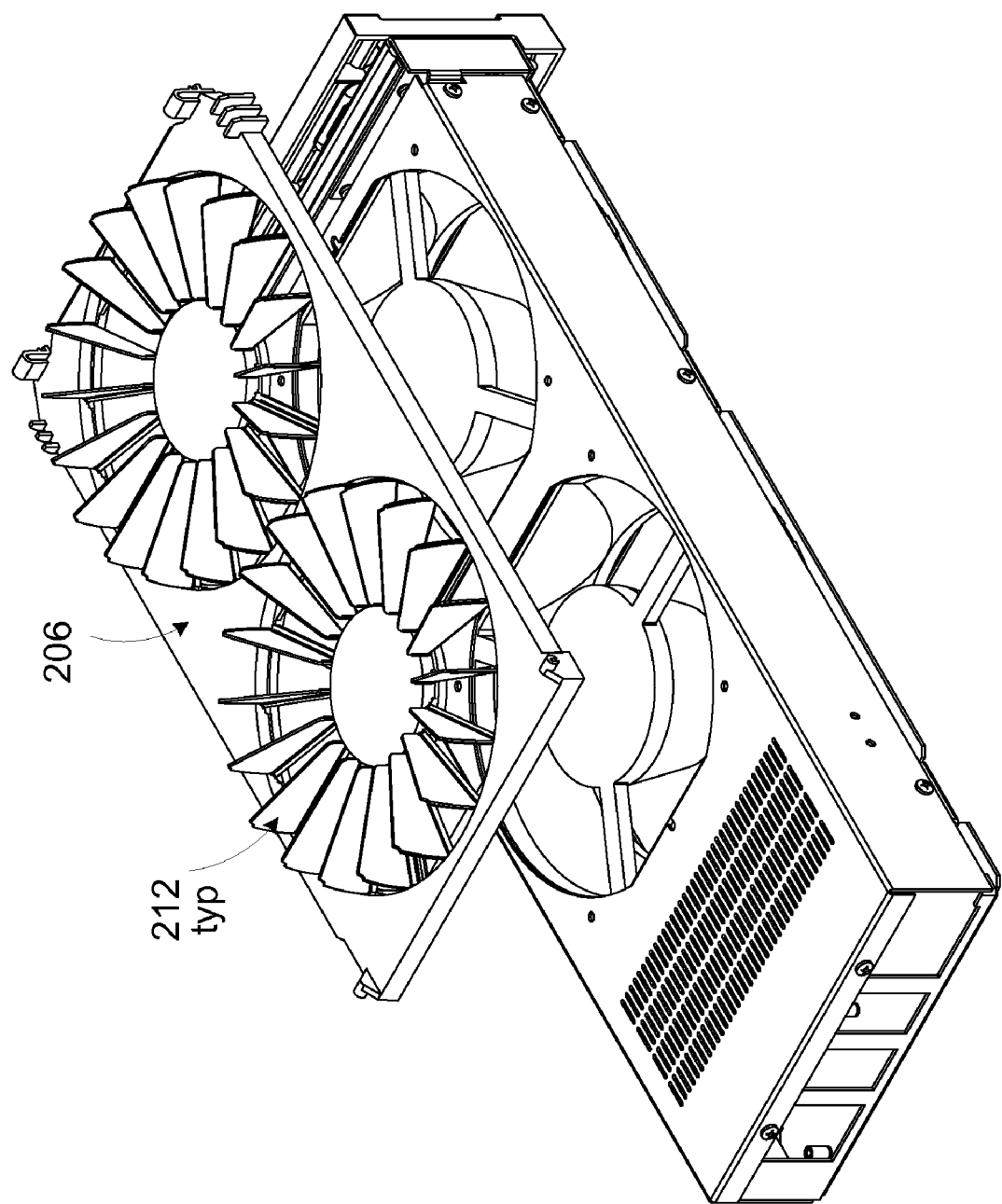

A fan tray module 200 according to an embodiment of the present invention is shown in the perspective drawings shown in FIGS. 2a, 2b, 2c, and 2d. FIG. 2a shows a fan tray module 200 with two axial fans 202 and 204, and a damper plate 206. The view shown in FIG. 2a is from the top rear (plug-in side) of the fan tray module 200. The damper plate 206 is shown lifted away from the axial fans 202 and 204 in order to give a view of the axial fans 202 and 204; fully assembled, the damper plate would be mounted directly adjacent the fans 202 and 204. The damper plate 206 may include, as shown, two circular fan covers 208 and 210. When assembled, the damper plate 206 is mounted so that the circular fan covers 208 and 210 cover the fans 202 and 204 respectively. Each fan cover (208 and 210) may include a set of radially disposed louvers 212, held within a circular opening in the damper plate 206, between a rim 214 of the opening and a hub 216 disposed in the center of the circular opening.

As shown in the magnified detail view, each louver 212 includes a blade 218 of a light weight solid material (such as sold under the trade name Makrolon or Valox) formed into a narrow truncated pie slice shape (for example). The louver 212 is designed to pivot along an axis 220 formed by one long edge of the blade 218. At the corners of the blade 218, the axis 220 is extended with short knobs (pegs) 222 and 224. Each louver 212 is inserted in a predetermined position between the rim 214 and the hub 216 of a fan cover (208 or 210) by squeezing the knobs 222 and 224 into corresponding predetermined indentations in the rim 214 and the hub 216, respectively.

Each fan cover (208 or 210) may include a set of, for example, 18 louvers 212 as described, and arranged so that each louver 212 can freely rotate around its axis 220 from a closed position to an open position. In the closed position, each louver 212 is positioned essentially in the plane of the damper plate 206, by virtue of being supported by its knobs 222 and 224, and resting through the force of gravity on the edge of the radially adjacent louver 212. In FIG. 2a, the louvers) 212 are shown in the closed position.

FIG. 2b shows the fan tray module 200 with the louvers 212 in the open position. As shown, the blade of each louver 212 is turned about 45 to 70 degrees from the closed position. In operation of the present cooling system, the (louvers 212 of a fan cover (208 or 210) may be pivoted into the open position shown in FIG. 2b and may be held in that open position by the force of the air flow generated by the corresponding fan 202 or 204, respectively. For clarity, the illustration in FIG. 2b shows the louvers 212 opening as much as 90 degrees from the closed position; however, the shape of the knobs (222 and 224) and the corresponding indentations in the rim 214 and the hub 216 should be designed to stop pivoting at about 45 to 70 degrees from the closed position to ensure the louvers 212 will close with gravity and not stay open when the fan is stopped.

Indeed, while the closed position of the louvers 212 is predisposed through the action of gravity, the louvers 212 of a fan may be held open through the upwardly-directed force imposed thereon by the airflow generated by the an operating fan. However, if the fan should stop, it is the intention of the design that the louvers 212 close as soon as possible, not only through the action of gravity but also as a result of the air pressure from above that is generated by the other fan (202 or 204) in the same fan tray module 200. Fans in the adjacent fan tray module in the same fan tray cage 114 are also expected to assist through the air pressure they contribute, in holding the louvers 212 of the stopped fan in the closed position.

Figure 2C:
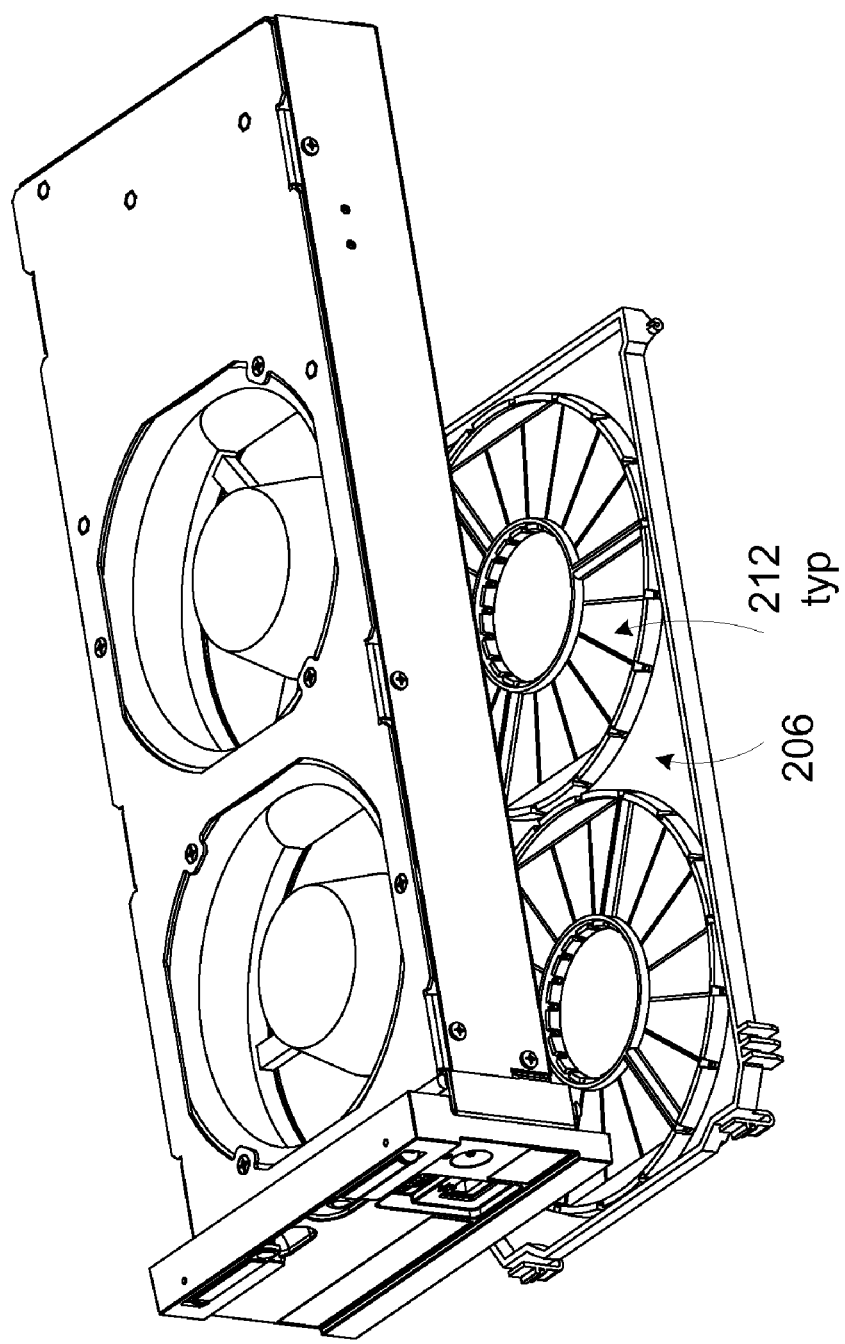
Figure 2D:
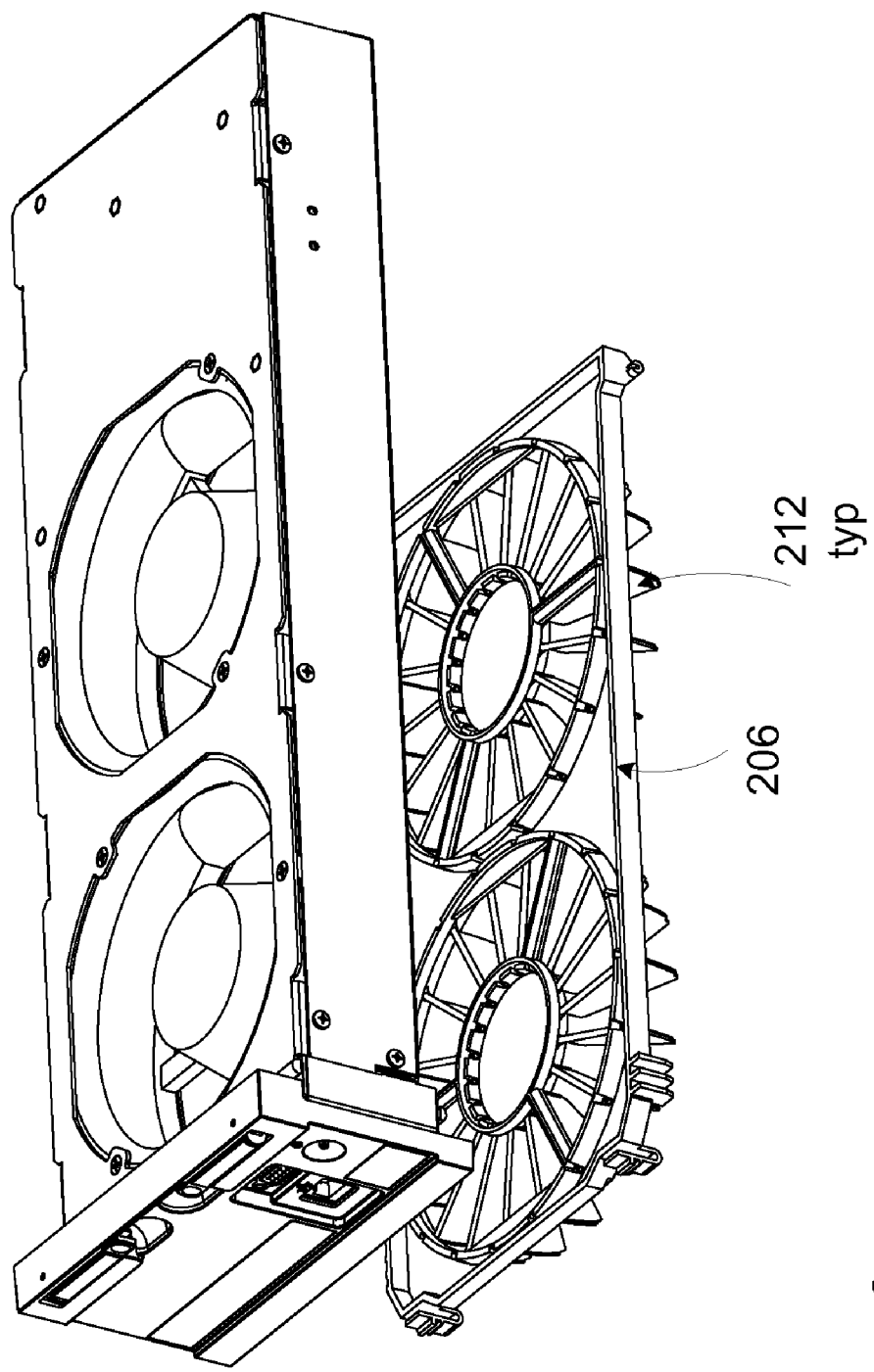

FIGS. 2c and 2d show the fan tray module 200 in a bottom front view, with the louvers) 212 in the closed and open position respectively. In these views, the damper plate 206 is shown lifted away from the axial fans 202 and 204 in order to provide a view of the damper plate 206. Fully assembled, however, the damper plate 206 would be mounted directly adjacent the fans 202 and 204.

Returning now to the views of the chassis 100 illustrated in FIGS. 1a to 1c. Each fan tray module 144 (FTM0 and FTM1) in the front fan tray cage 114 may be implemented as is the fan tray module 200 shown in and described relative to FIGS. 2a, 2b and 2c. Each such fan tray module provides a vertical air flow. Similarly, the fan tray modules 144 (FTM0 and FTM1) in the rear fan tray cage 120 may be implemented as shown in FIGS. 1a and 1c.

Thus, the front air flow 138 (as a whole) may be generated by the four fans located in the fan tray modules 144 (FTM0 and FTM1) located in the front of the midplane 110. This front air flow 138 is then substantially evenly divided as it passes through the ten interconnect modules 146 (IM0 to IM9) below the fan tray cage 114, and through the ten service modules 142 (SM0 to SM9) above the fan tray cage 114.

Figure 3:
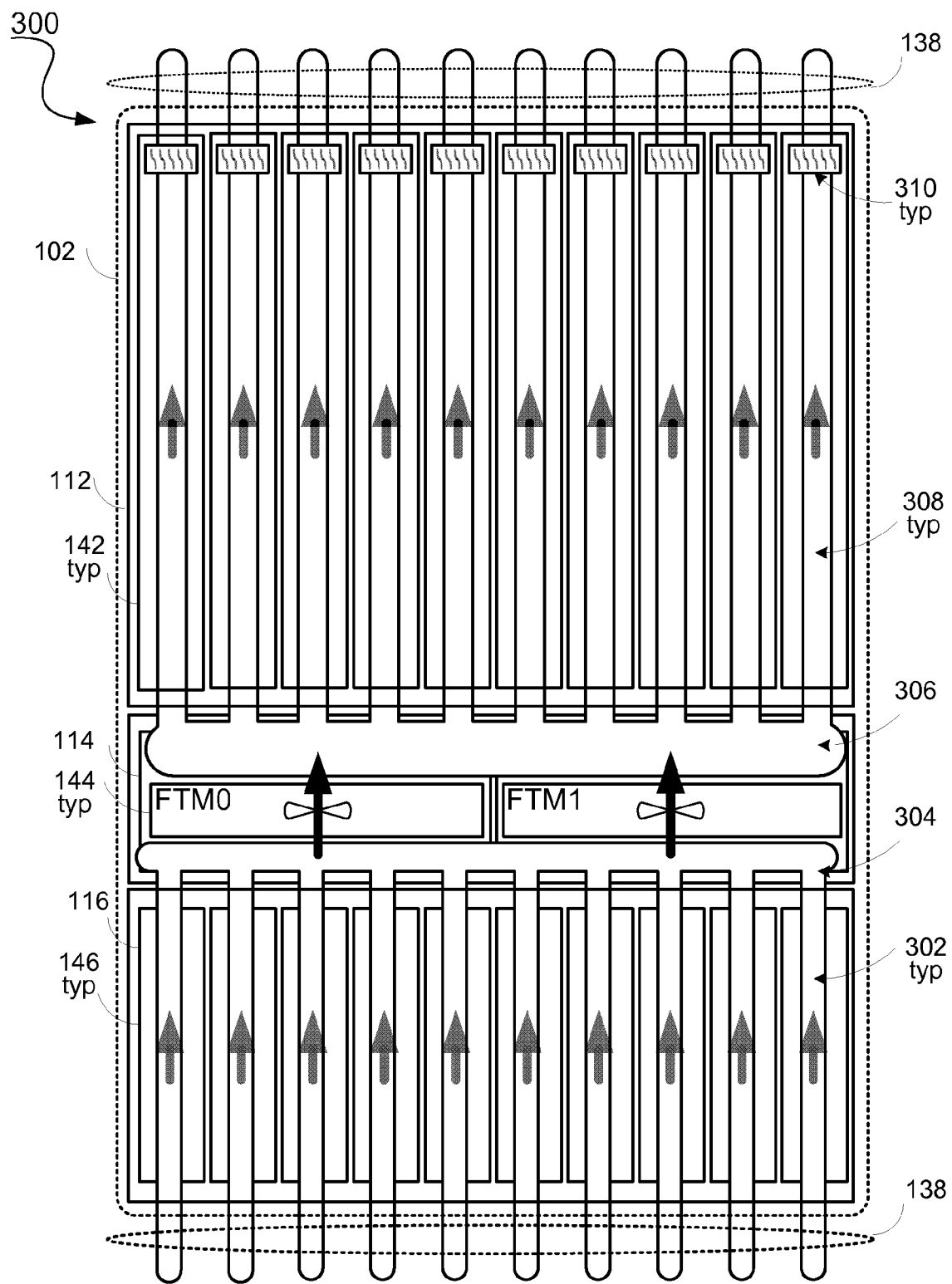
FIG. 3 illustrates an air flow distribution in a part of the chassis 100 of FIG. 1.

FIG. 3 shows an aspect of the front air flow 138 within a front part 300 of the electronics sub-system 102 in more detail. The rear air flow 140 within the rear part of the electronics sub-system 102 is analogous to the front air flow 138, and is not shown in detail.

The front part 300 of the electronics sub-system 102 may include the front service cage 112, the front fan tray cage 114, and the front interconnect cage 116, each with their full complement of corresponding modules (service modules 142, fan tray modules 144, and interconnect modules 146).

After passing through the air filter 132 (not shown in FIG. 3), the front air flow 138 enters the front part 300 of the electronics sub-system 102. Confined by the side walls of the chassis 100, and the circuit boards and front plates of each of the ten interconnect modules 146 (IM0 to IM9), and further restricted by the midplane 110, the front airflow 138 divides into ten lower air streams 302, each lower air stream 302 passing through the space of one interconnect module 146 in the front interconnect cage 116. Note that FIG. 3 is idealized in order to illustrate the concepts more clearly; it is not to scale and illustrates the air flow approximately only. In a physical system, the air flow is affected by the structural parts of the electronics sub-system 102 as well as the physical presence of components mounted within each of the modules themselves.

Each of the ten interconnect modules 146 (IM0 to IM9) is thus cooled by approximately one tenth of the total front air flow 138. After leaving the interconnect modules 146, the lower air streams 302 combine again into the front air flow 138 in a fan intake space 304 within the lower part of the front fan tray cage 114. The air flow is then propelled upwards by the combined action of the fans in the fan tray modules 144, into a "plenum" 306 in the upper part of the fan tray modules 144. The plenum 306 is a pressurized zone from which the air flow will again divide and stream into the ten service modules 142 in the front service cage 112, in the form of ten substantially equal upper air streams 308. Air pressure in the plenum 306 also aids in holding the louvers 212 above a failed (stopped) fan closed, thus preventing or reducing air leakage through the stopped fan which would result in an even greater pressure drop in the plenum 306 than the drop already caused by the reduction of active fans from four to three. Simulations and measurements have indicated that the pressure drop due to the failure of one fan is small. Simulated air flow rate data are presented in the written description of FIGS. 4 and 5, below.

Each of the ten service modules 142 (SM0 to SM9) is cooled by approximately one tenth of the total front air flow 138. Each of the ten upper air streams 308 serves to cool some components mounted on the corresponding service module 142 directly, or through heat sinks mounted on those components. Other components on the service module 142 which are connected to the liquid cooling subsystem (to be described below) are cooled indirectly by the upper air stream 308 passing through the heat exchanger. Heat exchangers are shown in FIG. 3 symbolically with reference numeral 310 near the top of each service module 142. However, the heat exchanger 310 need not be mounted at the top of each service module. Indeed, a heat exchanger may be mounted, for example, at or near the bottom of each service module 142 or anywhere between the top and bottom of each service module. Likewise, the position of other components may be changed from that shown and described herein without departing from the scope and spirit of the present inventions.

It should be noted that the interconnect modules 146 may be designed to dissipate less power and require comparatively less cooling than the service modules 142, the cooling requirements of the service modules 142 thus being dominant.

Simulations of the combined system of a representative worst case model of the service module 142 have indicated that the overall cooling requirement of the entire chassis 100 (a peak of 17 kW) may be achieved if an individual air flow intensity of at least 70 cubic feet per minute (CFM) through the heat exchanger 310 of each of the service modules 142 is maintained.

Figure 4:
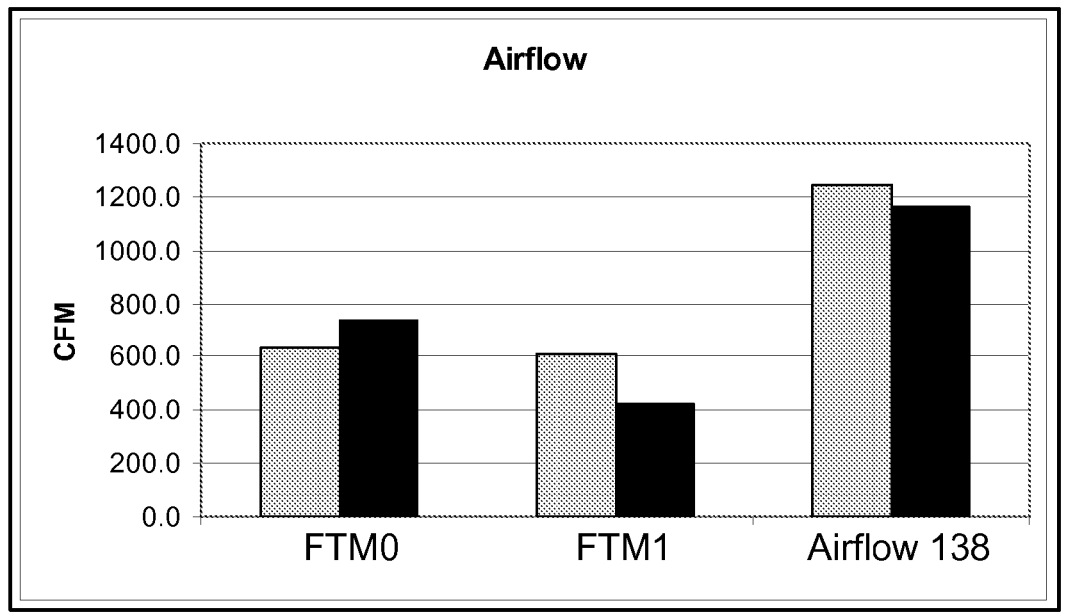
FIG. 4 is a chart of simulated flow rate data of the air flow 138 of FIG. 3.

FIG. 4 is a chart of simulated data of the total front air flow 138 of FIG. 3, and the contribution by each of the fan tray modules 144 (FTM0 and FTM1). The histogram shows the air flow rate in cubic feet per minute (CFM), for the individual air flows generated by the fan tray modules FTM0 and FTM1, and the combined air flow 138 which is the sum of the individual air flows.

The grey shaded set of columns indicates air flow rates with all four fans in the fan tray modules operating normally. The rate of the air flow 138 is approximately 1245 CFM, of which about 635 CFM is contributed by the FTM0 and 610 CFM is contributed by the FTM1. The contribution from each fan tray module (FTM0 and FTM1) is designed to be equal, but asymmetries in the geometry of the physical modules (which were modeled fairly accurately in the simulation) may give rise to the slightly different efficiencies of the two fan tray modules.

The second set of columns (solid black) indicates air flows when one of the two fans in the fan tray module FTM1 has failed (stopped). As indicated in the chart, the total air flow 138 is now reduced to approximately 1165 CFM of which about 737 CFM is contributed by the FTM0 (two fans operating) and 428 CFM is contributed by the single fan operating in FTM1.

The simulation indicates that the total air flow generated by three fans is only slightly reduced from the normal air flow generated by four fans, even though the fans operate at the same speed. In effect, the three non-failed fans individually each move more air into the common plenum 306 (FIG. 3), thus partially compensating for the lost air flow of the failed fan. This is due to the fact that the operating characteristics of the fans (at the selected flow rate) are such that a small drop in back pressure in the plenum 306 (due to the failure of one fan) can result in a significant increase in output flow from each of the other three fans.

As described above, the louvers 218 (FIGS. 2a-d) of the circular fan cover above the failed fan (for example the circular fan cover 208 above the fan 202) close and thus restrict, substantially prevent or substantially reduce the escape of air from the plenum 306 downward through the failed fan.

Figure 5:
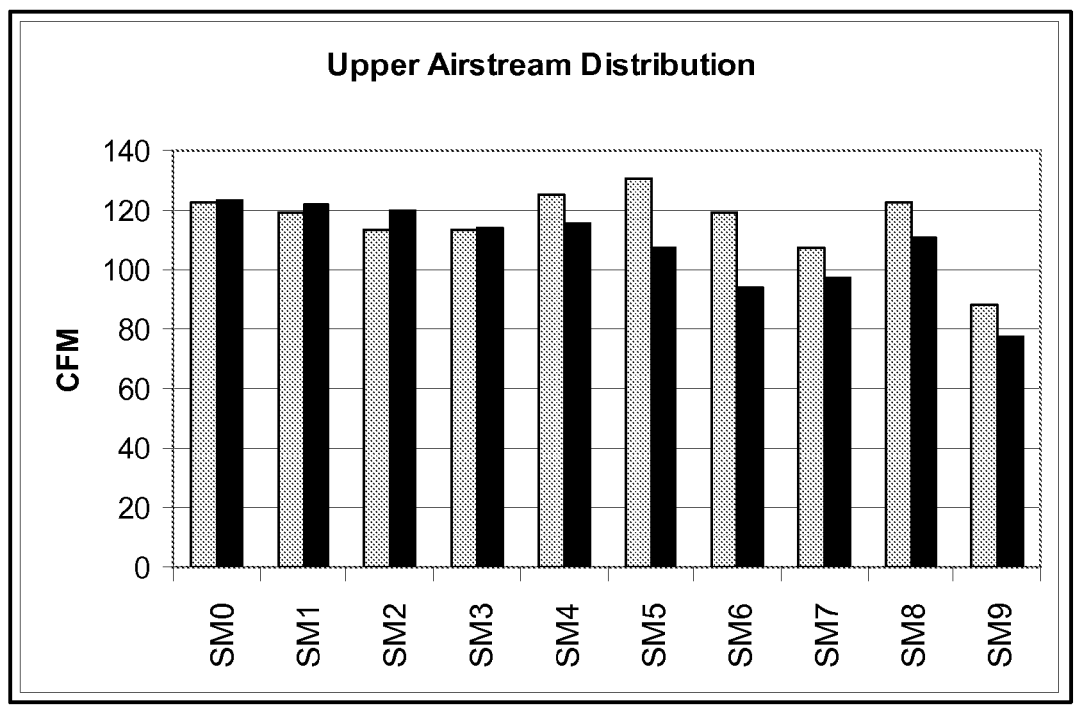
FIG. 5 is a chart of simulated flow rate data of the upper air streams 308 of FIG. 3.

Similarly, FIG. 5 is a chart of simulated data of the upper air streams 308 of FIG. 3, showing their distribution among the service modules 142 (SM0 to SM9). The grey shaded set of columns indicate air flow rates when all four fans in the fan tray modules 144 (FTM1 and FTM2) operate normally. The total air flow 138 of approximately 1245 CFM (FIG. 4) is distributed among the service modules SM0 to SM9 more or less evenly. Again a completely even distribution (ideally 124.5 CFM per service module) is not achieved due to geometrical factors.

When all four fans are operating (grey columns) the air flow rate in the upper air streams 308 ranges from a minimum of about 88 CFM (SM9) to a maximum of about 131 CFM (SM5). In order to maximize the flow rate of the upper air streams 308, leakage of air from the plenum 306 due to various factors may be minimized by well fitting parts and gaskets if necessary.

When (as shown in FIG. 4) one of the fans in the fan tray module FTM1 fails, the overall air flow from the plenum 306 into the service modules is reduced, but as shown in the solid black columns of FIG. 5, the distribution of the flow rates of the upper air streams 138 is still quite good.

The total reduced air flow rate of about 1165 CFM is distributed among the service modules SM0 to SM9 more or less evenly. With one of the four fans failed (as simulated) the air flow rate in the upper air streams 308 ranges from a minimum of about 77.3 CFM (SM9) to a maximum of about 123.6 CFM (SM0). As might be expected with only one fan operating in the right hand fan tray module FTM1, the drop of flow rate is more pronounced in the right hand set of service modules (SM 6 to SM 9) which are located above the right hand fan tray module FTM1. And, perhaps surprisingly, because of the higher output individually of each of the three non-failed fans, the air flow rate in some left hand modules (SM0 to SM3) is actually increased.

The valuable contribution of the plenum 306, interposed between the fan tray modules 144 and the service modules 142, is that even with only three fans operating in a very asymmetrical configuration (two working fans below five service modules, only one working fan below the remaining five service modules), sufficient cooling air flow may be provided to all service modules. The foregoing description, detailing air flow design in the front part of the chassis 100, equally applies to the rear part of the chassis 100, being of equivalent design.

In order to preserve a horizontally balanced air flow, it is preferred that service filler modules (not shown) be provided in all slots in the service module cage 112 and 118 that do not have functional service modules 142 inserted therein. Similarly, interconnect filler modules should be provided in all slots in the service module cage 116 and 122 that do not have functional interconnect modules 146 inserted therein.

Additionally, filler modules (such as service filler modules and interconnect filler modules) also balance the air flow distribution by presenting equivalent air impedance to air flow; provide increased product safety, provide Electromagnetic Containment and Immunity Compliance (EMC/EMI) for the product, and serve as a placeholder during shipping and handling of the chassis.

Filler modules typically do not contain any electrical components and do not make any physical or electrical connection with any mid-plane connectors. There are no fan tray filler modules, as all systems require that all fan tray cages (114, 120) be populated with functional fan tray modules 144.

An example of a service module is the Compute Module (CM), a functional and system description of which is provided in the commonly assigned and co-pending application incorporated by reference above. The CM provides the core block for multi-processing and may include, for example, four processor chips, associated memory and HyperTransport channels to enable both inter-processor communications and networking through external I/O. Because of the large amount of heat generated in this module, special consideration is given to cooling this module. Furthermore, because of the required packaging density (2×10 CMs in a 19" cage), conventional air heat sinks cooled simply by forced air, are not feasible.

Figure 6:
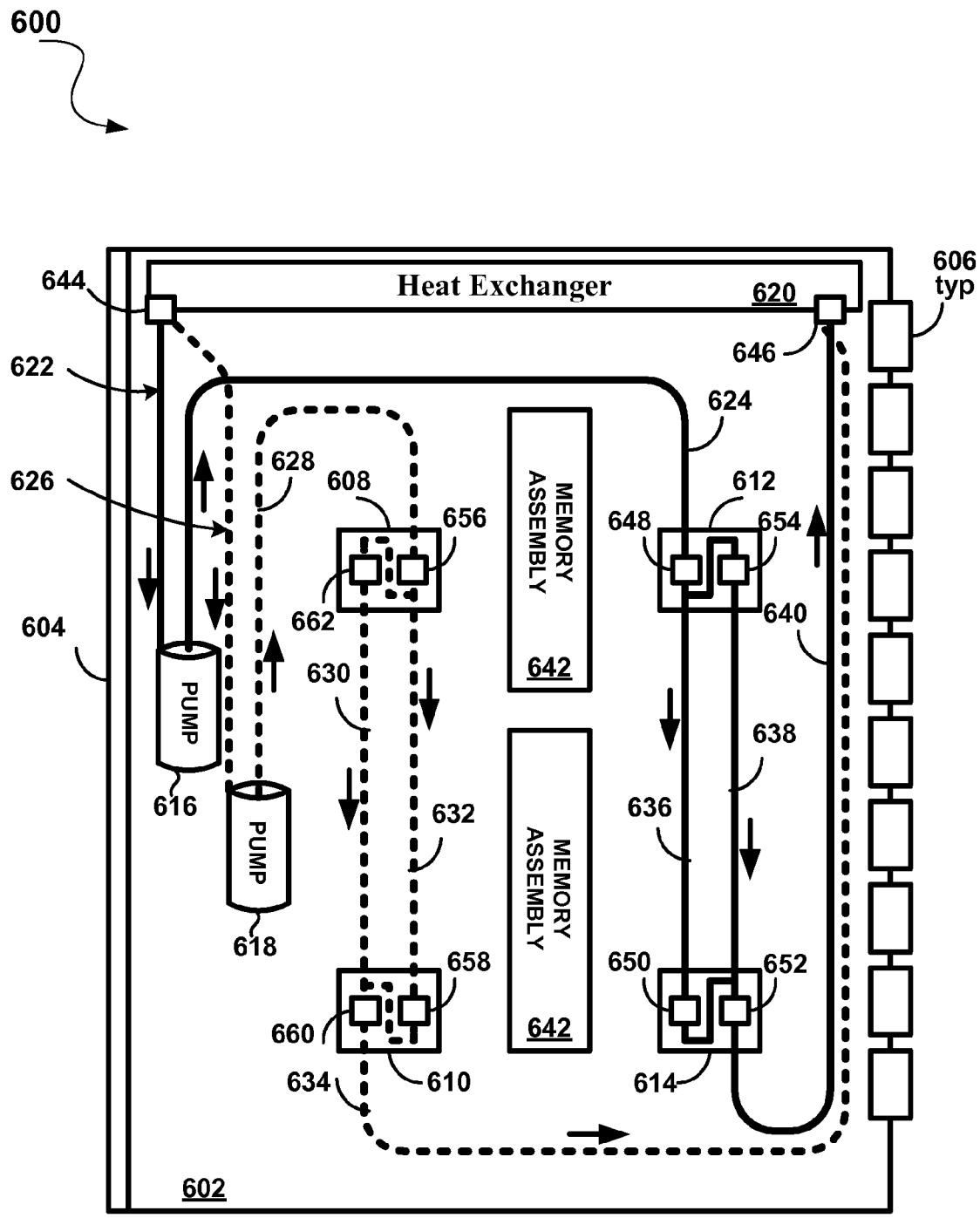
FIG. 6 shows a physical model of a computing module 600 according to an embodiment of a service module 112 of FIG. 1.

FIG. 6 shows a simplified physical model 600 of the service module 142 (based on the example of a compute module CM). FIG. 6 omits mechanical details, both in the interest of clarity and to emphasize the cooling aspects of the service module 142.

The exemplary embodiment of the service module 142, as shown in the physical model 600, includes a multilayer printed circuit board (PCB) 602. Attached or otherwise coupled to the PCB 602 are:

a front plate 604;

a number of connectors 606 for insertion into the midplane 110 (FIG. 1*a*);

four liquid cooled chip assemblies (608, 610, 612, and 614);

two pumps (616 and 618);

a heat exchanger 620;

ten tubing segments (622, 624, 626. 628, 630, 632, 634, 636, 638 and 640), and two exemplary memory assemblies 642.

Other components that may also be mounted on the PCB 602 are not shown in this simplified physical model 600 in the interest of clarity. Also, the service modules 142 need not be structured exactly as shown in FIG. 6 and as described above, as variations and modifications are possible, as those of skill in this art will recognize.

The physical model 600 is shown in the orientation in which it is operated, that is, the PCB 602 is disposed vertically, with the heat exchanger 620 mounted along the top, preferably occupying as much of the top edge (back to front) as possible, and preferably having a thickness sufficient to occupy virtually all available space between the present service module and its neighbor, in order to minimize the amount of air escaping around the heat exchanger 620. Additional measures, such as installing gaskets, may be taken in order to minimize air leakage and force as much of each upper air stream 308 (FIG. 3) to go through the heat exchanger 620 (310 in FIG. 3).

The two pumps (616 and 618) drive two closed liquid circuits which share the heat exchanger 620 as follows:

Each closed liquid circuit extends from an outlet 644 of the heat exchanger 620 ultimately back to an inlet 646 thereof.

The first closed liquid circuit, (passing though pump 616) extends through the tubing segment 622, into the pump 616 and out through the tubing segment 624 to an inlet 648 of the liquid cooled chip assembly 612. At the liquid cooled chip assembly 612, the first closed liquid circuit divides into a first part that passes straight through the inlet 648 and continues through the tubing segment 636 to an inlet 650 of the liquid cooled chip assembly 614. Thereafter, the first closed liquid circuit continues through the liquid cooled chip assembly 614 to an outlet 652 thereof. A second part of the first closed liquid circuit passes through the liquid cooled chip assembly 612 to an outlet 654 thereof, and continues through the tubing segment 638, to merge with the first part at the outlet 652. From the outlet 652 of the liquid cooled chip assembly 614, the remerged first closed liquid circuit then continues through the tubing segment 640 to the inlet 646 of the heat exchanger 620.

The second closed liquid circuit, (passing through pump 618) extends analogously from the outlet 644 of the heat exchanger 620 to its inlet 646 through the tubing segment 626 to the pump 618. The second closed liquid circuit reemerges from the pump 618 through the tubing segment 628 to an inlet 656 of the liquid cooled chip assembly 608. Thereafter, the second closed liquid circuit divides into a first part and a second part. The first part continues through the tubing segment 632 to an inlet 658 of the liquid cooled chip assembly 610, to the outlet 660 thereof. The second part leaves the liquid cooled chip assembly 608 through the outlet 662 thereof, continues through the tubing segment 630 where it merges with the first part. The second part continues through the outlet 660 of the liquid cooled chip assembly 610 out through the tubing segment 634 to the inlet 646 of the heat exchanger 620. The arrows in FIG. 6 indicate the direction of flow of the cooling fluid. The simplified physical model 600 of the service module 142 shown in FIG. 6 is merely an exemplary embodiment of the invention. It is within the scope of the invention to include more or fewer components within the first, second or additional closed circuits by additional liquid circuit tubing, pumps, and cold plates, as required.

Figure 7:
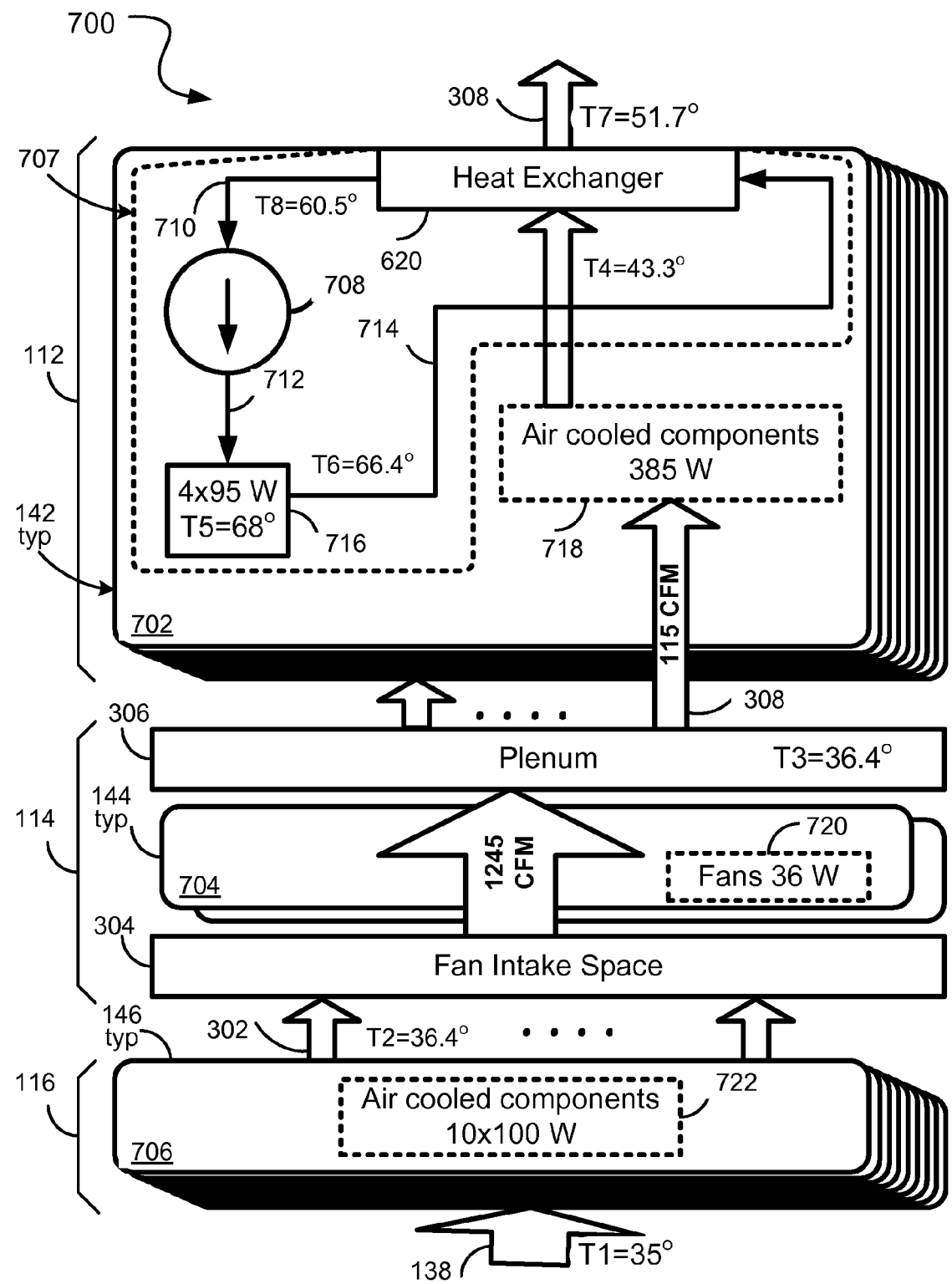
FIG. 7 is an exemplary thermal diagram 700 of the front part 300 of the electronics sub-system 102 of FIG. 3.

Shown in FIG. 7 is an exemplary thermal diagram 700 of the front part 300 of the electronics sub-system 102 (see FIG. 3), combined with details (further simplified from the physical model of FIG. 6) of one service module 142 (see FIG. 6). The same reference numerals as in FIGS. 3 and 6 are used for corresponding components. The thermal design of the rear part of the electronics sub-system 102 may be analogous to the front part thereof shown in FIG. 7.

The thermal diagram 700 shows the front service cage 112 with the ten service modules 142, one of which is shown in the form of a simple thermal model 702; the front fan tray cage 114 with the two fan tray modules 144, one of which is shown in the form of a simple thermal model 704, and the front interconnect cage 116 with the ten interconnect modules 146, one of which is shown in the form of a simple thermal model 706.

Derived from the physical model 600 of the service module 142 (see FIG. 6) the thermal model 702 of the service module 142 includes a liquid cooling subsystem 707. The liquid cooling subsystem 707 may include, as shown, the heat exchanger

620; a liquid pumping system 708 (which includes the pumps 616 and 618 of FIG. 6); a feeder tubing system 710 (the tubing segments 622 and 626 of FIG. 6) from the heat exchanger 620 to the liquid computing system 710; an inlet tubing system 712 (which includes the tubing segments 624, 628, 632, and 636 of FIG. 6); a return tubing system 714 (the tubing segments 630, 634, 638, and 640 of FIG. 6), and a set of liquid cooled components 716 (the four liquid cooled chip assemblies 608 to 614 of FIG. 6). The set of liquid components 716 together dissipate, in this exemplary embodiment, a total of up to 4×95 Watts=390 Watts. The thermal model 702 of FIG. 7 may also include a set of air cooled components 718 (which may include the memory assemblies 642 of FIG. 6, as well as other heat generating components not shown in FIG. 6) that together may dissipate up to about 385 Watts in the example developed herein.

The thermal model 704 of the fan tray module 144 may include a set of fans 720, which together may dissipate up to 36 Watts. The thermal model 706 of the interconnect module 146 may include another set of air cooled components 722, which may dissipate up to 100 Watts (1000 Watts collectively for the interconnect cage 116). Power dissipation numbers are exemplary worst case numbers and may deviate from typical observed values which are generally lower)

Air flows and air streams are shown in FIG. 7 symbolically in the form of white arrows. All temperatures shown in the diagram (in degrees Celsius) were obtained with a simulation of the thermal models.

The front air flow 138 enters the diagram at the bottom with an exemplary air temperature $T1=35°$, which is the highest temperature expected to be supplied according to the ASHREA standard (American Society of Heating, Refrigerating and Air-Conditioning Engineers). The front air flow 138 passes through the interconnect modules 146, in the form of the lower air streams 302 (see FIG. 3). Each of the lower air streams 302, flowing through its respective interconnect module 146, is heated by the another set of air cooled components 722, and subsequently leaves the front interconnect cage 116 at an increased air temperature of $T2=36.4°$, whereupon each of the heated air streams 302 enters the fan intake space 304.

The fans in the front fan tray cage 114 propel the air from the fan intake space 304 into the plenum 306, at an exemplary rate of 1245 cubic feet per minute (CFM), thus in effect creating the front air flow 138. The temperature of the air in the plenum 306, after passing through the fans is $T3=36.4°$. The increase in the air temperature due to the dissipation in the fans is negligible.

From the plenum 306, the air flow divides into the upper air streams 308 shown in FIG. 3, each entering the space of a representative one of the service modules 142, as described earlier.

Within the representative service modules 142, the air may be further heated by the set of air cooled components 718 to an air temperature of $T4=43.3°$, when it reaches the heat exchanger 620.

The set of liquid cooled components 716, dissipating 4×95=390 Watts, transfers generated heat to the liquid circulating in the liquid cooling subsystem 707, as described earlier. The feeder tubing system 710 joins the heat exchanger 620 to the liquid pumping system 708; the inlet tubing system 712 joins the liquid pumping system 708 to the set 716 of liquid cooled components; and the return tubing system 714 joins the set of liquid cooled components 716 back to the heat exchanger 620. A cooling fluid (for example, water mixed with glycol) circulates through this closed liquid cooling circuit. In the present exemplary embodiment, the cooling fluid flows from the heat exchanger 620, through the liquid pumping system, 708 and the set of liquid cooled components 716, before returning to the heat exchanger 620. In another embodiment, the cooling fluid may flow in the opposite direction and/or follow a different path In terms of cooling the set of liquid cooled components 716, a large proportion of their generated heat (at a component temperature $T5=68°$) is efficiently transferred to the circulating cooling fluid, which may attain a liquid temperature of $T6=66.4°$ as indicated in the diagram. A certain proportion of the heat is then transferred in the heat exchanger 620 from the circulating cooling fluid to the upper air stream 308 passing through the heat exchanger 620, thereby heating the air from $T4=43.3°$ to an exhaust air temperature of $T7=51.7°$ and at the same time cooling the circulating cooling fluid from $T6=66.4°$ to a temperature of $T8=60.5°$. When the cooled ($T8=60.5°$) liquid circulates through the liquid pumping system 708 back to the set of liquid cooled components 716, the cycle repeats.

Figure 8:
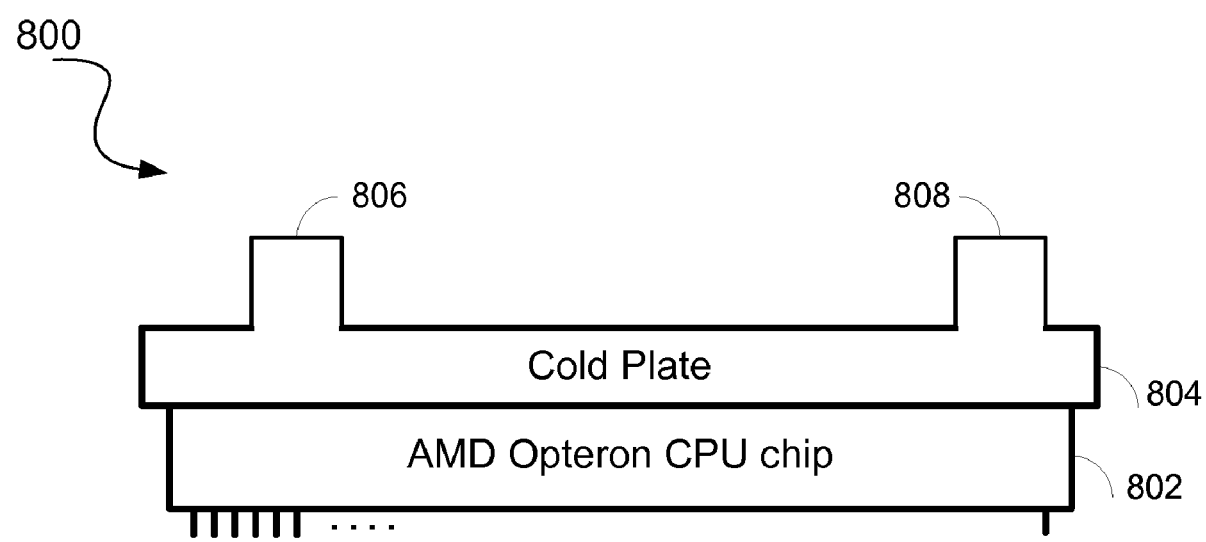
FIG. 8 illustrates a typical liquid cooled chip assembly 800 according to an embodiment of the invention.

FIG. 8 illustrates a typical liquid cooled chip assembly 800 according to an embodiment of the invention (for example, the liquid cooled chip assemblies 608 of FIG. 6). The liquid cooled chip assembly 800 may include, for example, an AMD Opteron CPU chip 802 attached to a cold plate 804 for transferring heat from the CPU chip 802 to the cooling fluid which circulates through the cold plate 804. The cold plate 804 has an inlet 806 and an outlet 808 (corresponding to the inlet 656 and the outlet 662 of the liquid cooled chip assemblies 608) for attaching tubing segments (e.g. the tubing segments 628, 630, and 632 in the case of the liquid cooled chip assemblies 608 as described in FIG. 3 above). The liquid cooling components including the cold plates, tubing material, pumps, and heat exchanger, may be custom made to dimensional and performance specifications by, for example, Thermacore, Inc. of Lancaster Pa.

Figure 9:
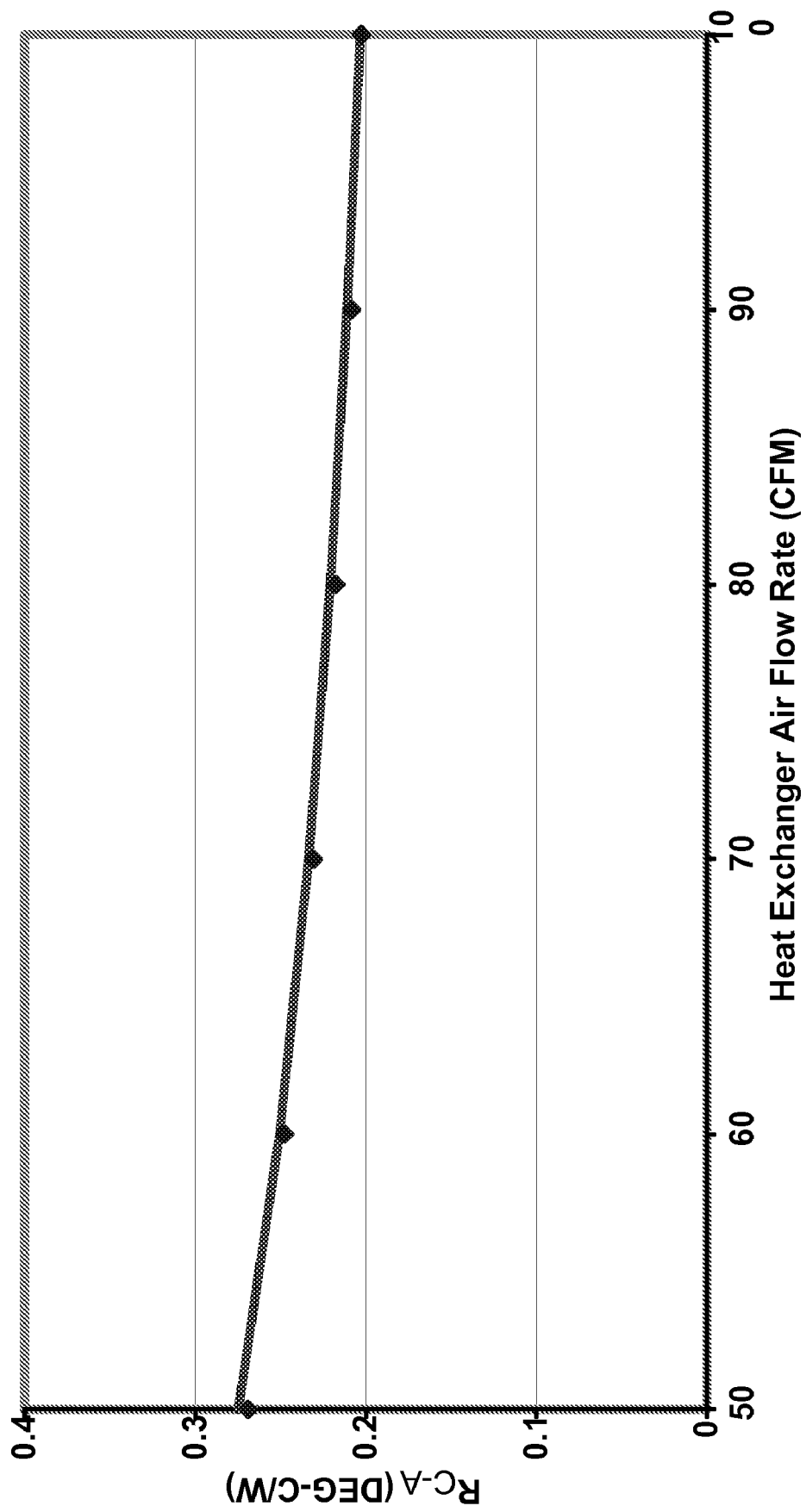
FIG. 9 is a graphical illustration of the specification (solid curve) and test results (diamond marks on are near the solid curve) of the overall performance of the liquid cooling sub-system 707 of FIG. 7.

FIG. 9 shows a graph illustrating the specification (solid curve) and test results (diamond marks on or near the solid curve) of the overall performance of the liquid cooling subsystem 707 of FIG. 7. Shown in the diagram is the heat resistance $R_{c-a}$ from the chip (the AMD Opteron CPU chip 802, FIG. 8) to the air flowing through the heat exchanger 620 in degrees Celsius per Watt, as a function of the amount of air flow (the upper air stream 308) through the heat exchanger 620 assuming an air intake temperature of $T4=43.3°$ (FIG. 8) at the heat exchanger 620. For example, as shown in the diagram of FIG. 9, the heat resistance has been determined to be 0.215 degrees/Watt at an assumed air flow rate of 90 cubic feet per minute (CFM). Thus, with an assumed chip dissipation of 95 W, and an air flow of 90 CFM, the chip temperature rise above the temperature T4 of the air flow is expected to be $T_{delta}=95×0.215=20.4°$. Added to the air temperature of $T4=43.30$, it is then expected that a chip temperature $T_{chip}=T4+T_{delta}=43.3°+20.4°=63.7°$ would be reached, which is well within the operating margins of the device (the AMD Opteron CPU chip 802). As the amount of airflow modeled in FIG. 7 (the upper air stream 308) is 115 CFM, a margin exists to allow for air leakage and variation in air flow relative to the typical service module 142. Even when the uneven distribution between service module slots, as well as the possibility of fan failure, is taken into account (as depicted in the simulation results of FIGS. 4 and 5), sufficient cooling of high-power chips is provided.

It may be appreciated that the numerical description of the thermal design has been provided as an example of a working design for handling particular heat loads that are largely determined by the electronic circuits in the various modules.

Other combinations of heat dissipation and air flow rates may be appropriate in other cases, as will be readily apparent to skilled persons.

While the foregoing detailed description has described preferred embodiments of the present invention, it is to be understood that the above description is illustrative only and not limiting of the disclosed invention. Those of skill in this art will recognize other alternative embodiments and all such embodiments are deemed to fall within the scope of the present invention. Thus, the present invention should be limited only by the claims as set forth below.

What is claimed is:

1. A computer system, comprising:
a chassis defining a front and a rear, the chassis including a vertically oriented midplane, the midplane including a plurality of front module slots for receiving front electronic modules from the front of the chassis, and a plurality of rear module slots for receiving rear electronic modules from the rear of the chassis;
a cooling system, the cooling system being configured to generate an upwardly-directed front air flow within the chassis directed at selected ones of the front electronic modules and being configured to generate an upwardly-directed rear air flow within the chassis directed at selected ones of the rear electronic modules, the front air flow being separate from and independent of the rear air flow;
wherein the cooling system includes an inlet separator baffle and an exhaust separator baffle, and wherein the inlet separator baffle, the midplane and the exhaust separator baffle are collectively configured in the chassis such that the front air flow and the rear air flow are isolated from one another and are independently controllable.

2. The computer system of claim 1, wherein the selected front electronic modules dissipate more power than remaining ones of the front electronic modules and wherein the selected rear electronic modules dissipate more power than remaining ones of the rear electronic modules.

3. The computer system of claim 2, wherein the cooling system includes at least one front fan that is disposed between the selected front electronic modules and remaining ones of the front electronic modules and at least one rear fan that is disposed between the selected rear electronic modules and remaining ones of the rear electronic modules.

4. The computer system of claim 3, wherein the at least one front fan is configured to draw air past the remaining front electronic modules and to accelerate the drawn air to form the front air flow and wherein the at least one rear fan is configured to draw air past the remaining rear electronic modules and to accelerate the drawn air to form the rear air flow.

5. The computer system of claim 3, wherein the cooling system includes front fans disposed below the selected front electronic modules and rear fans disposed below the selected rear electronic modules.

6. The computer system of claim 1, wherein the cooling system includes a front fan tray module coupled to the chassis for generating the upwardly-directed front air flow and a rear fan tray module coupled to the chassis for generating the upwardly directed rear air flow.

7. The computer system of claim 6, wherein the front fan tray module and the rear fan tray module are each removably coupled to the chassis.

8. The computer system of claim 6, wherein the front electronic modules include front function modules and front interconnect modules, wherein the rear electronic modules include rear function modules and rear interconnect modules and wherein the front fan tray module includes a number of front fans that is less than a number of the front function modules and wherein the rear fan tray module includes a number of rear fans that is less than a number of the rear function modules.

9. The computer system of claim 1, wherein the front air flow enters a front plenum from which the front air flow divides into a plurality of front air streams by the selected front electronic modules and wherein the rear air flow enters a rear plenum from which the rear air flow divides into a plurality of rear air streams by the selected rear electronic modules.

10. The computer system of claim 9, wherein the selected front electronic modules are front function modules and wherein the selected rear electronic modules are rear function modules.

11. The computer system of claim 9, wherein the plurality of front air streams are substantially equal to one another and wherein the plurality of rear air streams are substantially equal to one another.

12. The computer system of claim 9, wherein the cooling system includes a front fan tray module coupled to the chassis for generating the upwardly-directed front air flow and a rear fan tray module coupled to the chassis for generating the upwardly directed rear air flow; and wherein each of the front and rear fan tray modules includes at least a first and a second fan and wherein the front plenum is disposed between the at least first and second front fan of the front fan tray module and the selected front electronic modules, and wherein the rear plenum is disposed between the at least first and second rear fan of the rear fan tray module and the selected rear electronic modules.

13. The computer system of claim 1, further comprising a plurality of front function modules received into selected ones of the front module slots and a plurality of rear function modules received into selected ones of the rear module slots, each of the front and rear function modules including:
an electronic component; and
a liquid cooling sub system including a cool plate coupled to the electronic component to absorb heat generated by the electronic component; a pump; a fluid-to-air heat exchanger; tubing connecting the cool plate, the pump and the heat exchanger in a closed circuit, and closed circuit cooling fluid that is pumped through the closed circuit to transport heat from the cool plate to the heat exchanger, and from the closed circuit cooling fluid to the front or rear air flow.

14. The computer system of claim 13, wherein each of the front and rear function modules has a six-sided volume shape that is substantially closed on first to fourth sides, open on a fifth side for admitting the air flow, and terminated by the heat exchanger on a sixth side that is opposite the fifth side, such that most of the air flow that is directed thereto flows through the heat exchanger.

15. A computer system, comprising:
a chassis defining a front and a rear, the chassis including a vertically oriented midplane, the midplane including a plurality of front module slots for receiving front electronic modules from the front of the chassis, and a plurality of rear module slots for receiving rear electronic modules from the rear of the chassis;
a cooling system, the cooling system including a front fan tray module for generating an upwardly-directed front air flow within the chassis directed at selected ones of the front electronic modules, and a rear fan tray module for generating an upwardly-directed rear air flow within the chassis directed at selected ones of the rear electronic modules, the front air flow being separate from and independent of the rear air flow;

wherein the front air flow enters a front plenum from which the front air flow divides into a plurality of front air streams by the selected front electronic modules and wherein the rear air flow enters a rear plenum from which the rear air flow divides into a plurality of rear air streams by the selected rear electronic modules;

wherein each of the front and rear fan tray modules includes at least a first and a second fan and wherein the front plenum is disposed between the at least first and second front fan of the front fan tray module and the selected front electronic modules, and wherein the rear plenum is disposed between the at least first and second rear fan of the rear fan tray module and the selected rear electronic modules; and wherein the computer system further comprises a plurality of sets of louvers, each of the plurality being disposed between an underlying one of the first and second fans of the front and rear fan tray modules and the front and rear plenums, respectively, and wherein the louvers of each of the plurality of sets of louvers are configured to pivot to an open configuration when their respective underlying fan is operating and to pivot to a closed configuration when their respective underlying fan is not operating.

16. The computer system of claim 15, wherein the louvers of each of the plurality of sets of louvers are configured to pivot to the closed configuration by a combination of gravity and a pressure of the air in either the front or rear plenum.

17. The computer system of claim 15, wherein the louvers of each set of louvers are radially aligned with a center of their respective underlying fan.

18. The computer system of claim 15, wherein the sets of louvers disposed between the first and second fans of the front fan tray module and the front plenum are pivotally coupled to a front louver tray configured to fit over the front fan tray module and wherein the sets of louvers disposed between the first and second fans of the rear fan tray module and the rear plenum are pivotally coupled to a rear louver tray configured to fit over the rear fan tray module.

19. A method of cooling a computer system, comprising:
providing a chassis defining a front and a rear, the chassis including an inlet separator baffle, an exhaust separator baffle and a vertically oriented midplane, the midplane including a plurality of front module slots for receiving front electronic modules from the front of the chassis, and a plurality of rear module slots for receiving rear electronic modules from the rear of the chassis;
generating an upwardly-directed front air flow within the chassis directed at selected ones of the front electronic modules; and
generating an upwardly-directed rear air flow within the chassis directed at selected ones of the rear electronic modules
wherein the front air flow is isolated and separate from, and independent of, the rear air flow, and the front air flow and the rear air flow are independently controlled.

20. The method of claim 19, wherein the front air flow generating step includes providing front fans below the selected front electronic modules and wherein the rear air flow generating step includes providing rear fans disposed below the selected rear electronic modules, and wherein remaining ones of the front electronic modules having lower power dissipation than the selected front electronic modules are located below the front fans, and wherein remaining ones of the rear electronic modules having lower power dissipation than the selected rear electronic modules are located below the rear fans.

21. The method of claim 19, wherein the front air flow generating step includes providing a front fan tray module coupled to the chassis and wherein the rear air flow generating step includes providing a rear fan tray module coupled to the chassis.

22. The method of claim 21, wherein the providing a front fan tray module step is carried out with the front electronic modules including front higher power dissipating modules and front lower power dissipating modules, wherein the providing a rear fan tray module step is carried out with the rear electronic modules including rear higher power dissipating modules and rear lower power dissipating modules and wherein the front air flow generating step is carried out with the front fan tray modules including a number of front fans that is less than a number of the front higher power dissipating modules and wherein the rear air flow generating step is carried out with the rear fan tray module including a number of rear fans that is less than a number of the rear higher power dissipating modules.

23. The method of claim 19, wherein the front air flow generating step enters a front plenum from which the front air flow divides into a plurality of front air streams by selected ones of the front electronic modules and wherein the rear air flow generating step enters a rear plenum from which the rear air flow divides into a plurality of rear air streams by selected ones of the rear electronic modules.

24. The method of claim 23, wherein the front air flow generating step is carried out with the selected front electronic modules being configured to dissipate more power than remaining ones of the front electronic modules and wherein the front air flow generating step is carried out with the selected rear electronic modules being configured to dissipate more power than remaining ones of the rear electronic modules.

25. The method of claim 23, wherein the front air flow generating step is carried out with the plurality of front air streams being substantially equal to one another and wherein the rear air flow generating step is carried out with the plurality of rear air streams being substantially equal to one another.

26. The method of claim 19, wherein the front air flow generating step includes providing a first front fan and a second front fan and providing a front plenum between the first and second front fans and selected ones of the front module slots, and wherein the rear air flow generating step includes providing a first rear fan and a second rear fan and providing a rear plenum between the first and second rear fans and selected ones of the rear module slots.

27. The method of claim 26, wherein the selected front module slots are configured to receive electronic modules that dissipate more power than remaining ones of the front electronic modules and wherein the selected rear module slots are configured to receive electronic modules that dissipate more power than remaining ones of the rear electronic modules.

28. The method of claim 19, further comprising a step of providing a plurality of front function modules received into selected ones of the front module slots and a plurality of rear function modules received into selected ones of the rear module slots, each of the front and rear function modules including:
an electronic component; and
a liquid cooling sub system including a cool plate coupled to the electronic component to absorb heat generated by the electronic component; a pump; a fluid-to-air heat exchanger; tubing connecting the cool plate, the pump, and the heat exchanger in a closed circuit, and closed circuit cooling fluid that is pumped through the closed circuit to transport heat from the cool plate to the heat exchanger, and from the closed circuit cooling fluid to the front or rear air flow.

29. The method of claim 28, wherein each of the front and rear function modules has a six-sided volume shape that is substantially closed on first to fourth sides, open on a fifth side for admitting the air flow, and terminated by the heat exchanger on a sixth side that is opposite the fifth side, such that most of the air flow that is directed thereto flows through the heat exchanger.

30. A method of cooling a computer system, comprising:
providing a chassis defining a front and a rear, the chassis including a vertically oriented midplane, the midplane including a plurality of front module slots for receiving front electronic modules from the front of the chassis, and a plurality of rear module slots for receiving rear electronic modules from the rear of the chassis,
generating an upwardly-directed front air flow within the chassis directed at selected ones of the front electronic modules; and
generating an upwardly-directed rear air flow within the chassis directed at selected ones of the rear electronic modules, such that the front air flow is separate from and independent of the rear air flow;
wherein the front air flow generating step includes providing a first front fan and a second front fan and providing a front plenum between the first and second front fans and selected ones of the front module slots, and wherein the rear air flow generating step includes providing a first rear fan and a second rear fan and providing a rear plenum between the first and second rear fans and selected ones of the rear module slots;
and wherein the method further includes steps of providing a first and second sets of front louvers disposed between an underlying one of the first and second front fans, respectively, and the front plenum and providing a first and second sets of rear louvers disposed between an underlying one of the first and second rear fans, respectively, and the rear plenum, and wherein constituent louvers of the sets of front and rear louvers are configured to pivot to an open configuration when their respective underlying fan is operating and to pivot to a closed configuration when their respective underlying fan is stopped.

31. The method of claim 30, wherein the louvers of each of the first and second front and rear sets of louvers are configured to pivot to the closed configuration by a combination of gravity and a pressure of the air in either the front or rear plenum.

32. The method of claim 26, further comprising a step of restricting an amount of air that leaks back through a stopped one of the first, second, front and rear fans.

* * * * *